US012696442B2

(12) United States Patent
Ai et al.

(10) Patent No.: US 12,696,442 B2
(45) Date of Patent: Jul. 28, 2026

(54) MEMORY, AND METHOD FOR MANUFACTURING MEMORY

(71) Applicant: BEIJING SUPERSTRING ACADEMY OF MEMORY TECHNOLOGY, Daxing District (CN)

(72) Inventors: Xuezheng Ai, Daxing District (CN); Xiangsheng Wang, Daxing District (CN); Guilei Wang, Daxing District (CN); Chao Zhao, Daxing District (CN); Jin Dai, Daxing District (CN); Wenhua Gui, Daxing District (CN)

(73) Assignee: BEIJING SUPERSTRIG ACADEMY OF MEMORY TECHNOLOGY, Beijing (CN)

( * ) Notice: Subject to any disclaimer, the term of this patent is extended or adjusted under 35 U.S.C. 154(b) by 339 days.

(21) Appl. No.: 18/695,254

(22) PCT Filed: Aug. 21, 2023

(86) PCT No.: PCT/CN2023/114102
§ 371 (c)(1),
(2) Date: Mar. 25, 2024

(87) PCT Pub. No.: WO2024/198208
PCT Pub. Date: Oct. 3, 2024

(65) Prior Publication Data
US 2024/0381626 A1 Nov. 14, 2024

(30) Foreign Application Priority Data
Mar. 24, 2023 (CN) .......................... 202310298824.0

(51) Int. Cl.
*H10B 12/00* (2023.01)

(52) U.S. Cl.
CPC ........... *H10B 12/482* (2023.02); *H10B 12/02* (2023.02); *H10B 12/488* (2023.02)

(58) Field of Classification Search
CPC .... H10B 12/482; H10B 12/02; H10B 12/488; H10B 12/30; H10B 41/27
See application file for complete search history.

(56) References Cited

U.S. PATENT DOCUMENTS

| | | | | |
|---|---|---|---|---|
| 5,877,522 A | * | 3/1999 | Kasai | H10B 12/315 |
| | | | | 257/E21.654 |
| 6,190,960 B1 | * | 2/2001 | Noble | H10B 12/488 |
| | | | | 257/E27.087 |

(Continued)

FOREIGN PATENT DOCUMENTS

| | | | | | |
|---|---|---|---|---|---|
| CN | 113903743 A | * | 1/2022 | ........... | H10W 20/42 |
| CN | 114121814 A | | 3/2022 | | |

(Continued)

OTHER PUBLICATIONS

International search report of PCT application No. PCT/CN2023/114102 issued on Oct. 26, 2023.

(Continued)

*Primary Examiner* — Laura M Menz
(74) *Attorney, Agent, or Firm* — Tucker Ellis LLP

(57) ABSTRACT

Disclosed is a memory, a method for manufacturing the memory. The memory includes: one or more layers of memory cell arrays stacked in a direction perpendicular to a substrate; a plurality of wordlines that penetrate through one or more layers of the memory cell arrays; and a plurality of bitlines, wherein each memory cell includes a semiconductor layer that surrounds a sidewall of the wordline and extends along the sidewall and each bitline is connected to the semiconductor layers of a column of memory cells in one layer of the memory cell array, wherein the bitline is composed of different branch lines, and the semiconductor (Continued)

layer of each memory cell is connected to two adjacent first branch lines but is not connected to at least a part of the region of the second branch line between the two adjacent first branch lines.

20 Claims, 18 Drawing Sheets

(56) References Cited

U.S. PATENT DOCUMENTS

| | | | | |
|---|---|---|---|---|
| 11,127,783 | B2 * | 9/2021 | Zhu | H10N 50/01 |
| 12,310,030 | B2 * | 5/2025 | Wang | H10N 50/01 |
| 12,317,511 | B2 * | 5/2025 | Zhu | H10D 30/63 |
| 12,328,863 | B2 * | 6/2025 | Dai | H10D 30/6755 |
| 12,342,735 | B2 * | 6/2025 | Lee | G11C 13/0028 |
| 12,476,185 | B2 * | 11/2025 | Kim | H10B 43/27 |
| 2011/0111568 | A1 * | 5/2011 | Kim | H10D 30/63 257/E21.421 |
| 2012/0153247 | A1 * | 6/2012 | Baek | H10B 63/845 257/E45.001 |
| 2019/0157345 | A1 * | 5/2019 | Zhu | H10B 61/00 |
| 2020/0006557 | A1 * | 1/2020 | Ko | H10D 30/792 |
| 2021/0408118 | A1 * | 12/2021 | Zhu | H10N 50/01 |
| 2022/0068929 | A1 * | 3/2022 | Karda | H10B 12/30 |
| 2022/0399341 | A1 * | 12/2022 | Kim | H10B 12/30 |
| 2023/0066016 | A1 * | 3/2023 | Wang | H10B 61/22 |
| 2023/0170295 | A1 * | 6/2023 | Kim | H10B 43/27 257/314 |
| 2023/0413513 | A1 * | 12/2023 | Tang | H10B 12/30 |
| 2024/0130106 | A1 * | 4/2024 | Dai | H10B 12/05 |
| 2024/0172571 | A1 * | 5/2024 | Lee | G11C 13/0028 |
| 2024/0381626 | A1 * | 11/2024 | Ai | H10B 12/02 |
| 2025/0016989 | A1 * | 1/2025 | Hua | H10B 12/00 |
| 2025/0056789 | A1 * | 2/2025 | Nam | H10B 12/482 |
| 2025/0227920 | A1 * | 7/2025 | Lee | H10B 12/03 |
| 2025/0279399 | A1 * | 9/2025 | Park | H10D 88/00 |
| 2026/0035789 | A1 * | 2/2026 | Gao | C23C 16/45529 |
| 2026/0052971 | A1 * | 2/2026 | Kim | H10B 43/27 |

FOREIGN PATENT DOCUMENTS

| | | | | | |
|---|---|---|---|---|---|
| CN | 115036274 | A | * | 9/2022 | H10B 12/30 |
| CN | 115332264 | A | * | 11/2022 | H10D 30/69 |
| CN | 115346988 | A | * | 11/2022 | H10D 30/6755 |
| CN | 115411033 | A | | 11/2022 | |
| CN | 115472608 | A | | 12/2022 | |
| CN | 115346988 | B | * | 1/2023 | H10D 30/6755 |
| CN | 115835626 | A | * | 3/2023 | H10B 12/00 |

| | | | | | |
|---|---|---|---|---|---|
| CN | 115867026 | A | * | 3/2023 | H10B 12/30 |
| CN | 115996570 | A | * | 4/2023 | H10B 41/27 |
| CN | 115996570 | B | * | 6/2023 | H10B 41/27 |
| CN | 116209273 | A | * | 6/2023 | H10W 20/43 |
| CN | 116322041 | A | * | 6/2023 | H10D 84/0149 |
| CN | 116367537 | A | * | 6/2023 | H10B 12/30 |
| CN | 116322041 | B | * | 11/2023 | H10D 84/0149 |
| CN | 115835626 | B | * | 4/2024 | H10B 12/00 |
| CN | 118943009 | A | * | 11/2024 | H10W 74/137 |
| CN | 119110581 | A | * | 12/2024 | H10B 12/0335 |
| CN | 119277764 | A | * | 1/2025 | H10B 12/482 |
| CN | 119277776 | A | * | 1/2025 | H10B 12/50 |
| CN | 119486112 | A | * | 2/2025 | H10B 12/02 |
| CN | 119922905 | A | * | 5/2025 | |
| CN | 120018494 | A | * | 5/2025 | H10W 20/435 |
| CN | 120224676 | A | * | 6/2025 | H10B 12/02 |
| CN | 120457237 | A | * | 8/2025 | C23C 16/45536 |
| CN | 120936033 | A | * | 11/2025 | H10B 41/10 |
| CN | 121057196 | A | * | 12/2025 | |
| DE | 102006045709 | A1 | * | 4/2008 | H10D 1/665 |
| EP | 4277449 | A1 | * | 11/2023 | H10D 30/6728 |
| JP | H05218346 | A | * | 8/1993 | |
| JP | 2023081342 | A | * | 6/2023 | H10B 41/27 |
| JP | 2025521285 | A | * | 7/2025 | H10P 95/00 |
| KR | 20090125969 | A | * | 12/2009 | G11C 8/10 |
| KR | 20120004605 | A | * | 1/2012 | H10D 84/0149 |
| KR | 101607265 | B1 | * | 3/2016 | H10D 84/016 |
| KR | 20190064960 | A | * | 6/2019 | G11C 5/063 |
| KR | 20220153308 | A | * | 11/2022 | H01L 27/11565 |
| KR | 20220166618 | A | * | 12/2022 | G11C 5/063 |
| KR | 102728202 | B1 | * | 11/2024 | H10D 1/696 |
| KR | 102731055 | B1 | * | 11/2024 | H10D 62/402 |
| KR | 102736487 | B1 | * | 12/2024 | H10B 12/30 |
| KR | 102801636 | B1 | * | 5/2025 | H10W 20/435 |
| KR | 20250166320 | A | * | 11/2025 | H10D 84/0149 |
| WO | WO-2024130964 | A1 | * | 6/2024 | H10B 12/00 |
| WO | WO-2024159668 | A1 | * | 8/2024 | G11C 11/401 |
| WO | WO-2024198208 | A1 | * | 10/2024 | H10B 41/27 |
| WO | WO-2024198208 | A9 | * | 10/2024 | H10B 41/27 |
| WO | WO-2024212546 | A1 | * | 10/2024 | H10D 84/0149 |
| WO | WO-2024212546 | A9 | * | 12/2024 | H10D 84/0149 |
| WO | WO-2025139300 | A1 | * | 7/2025 | H10B 12/48 |

OTHER PUBLICATIONS

China National Intellectual Property Administration, First office action of Chinese application No. 202310298824.0 issued on Apr. 24, 2023, which is foreign counterpart application of this US application.

* cited by examiner

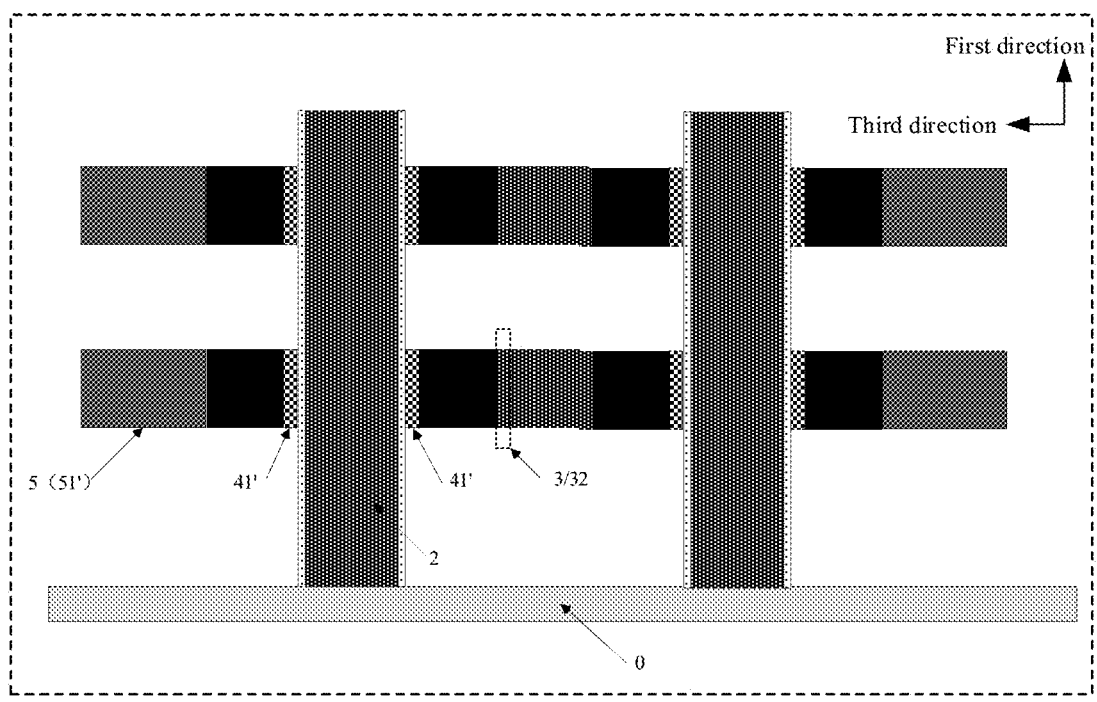
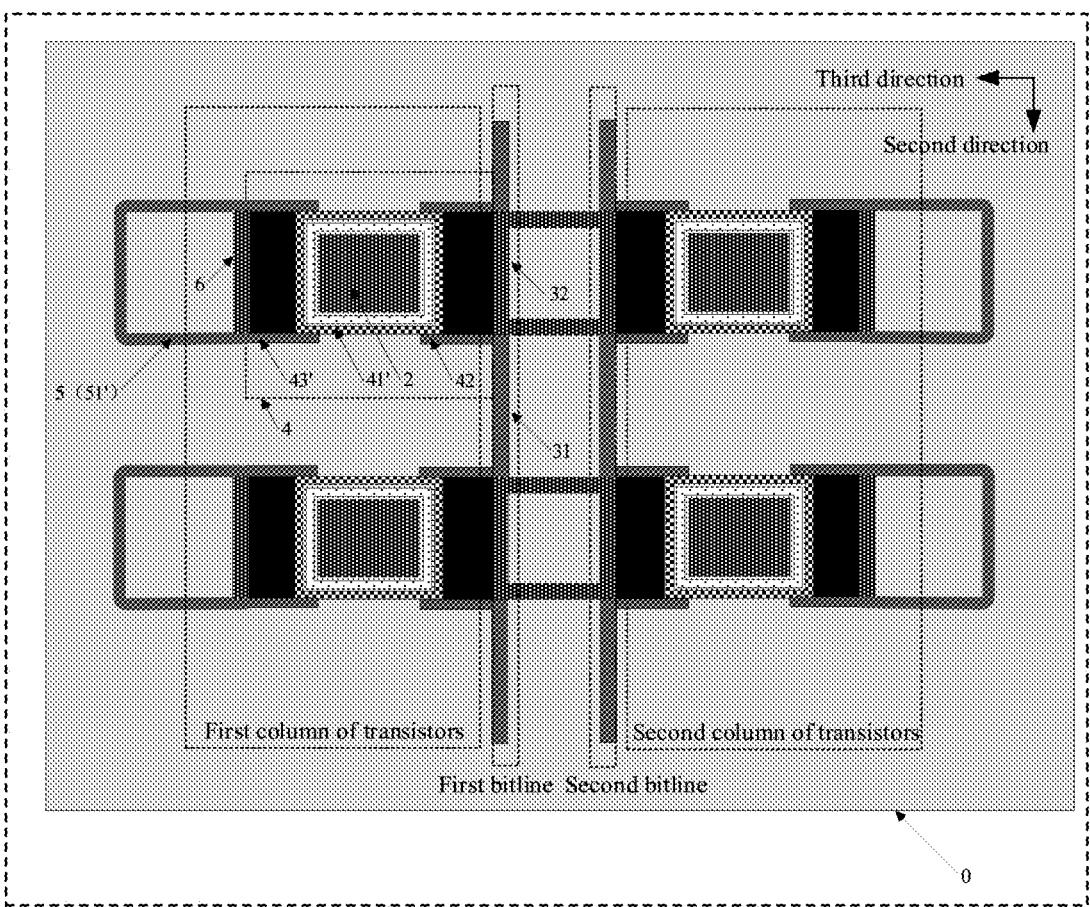
FIG. 12

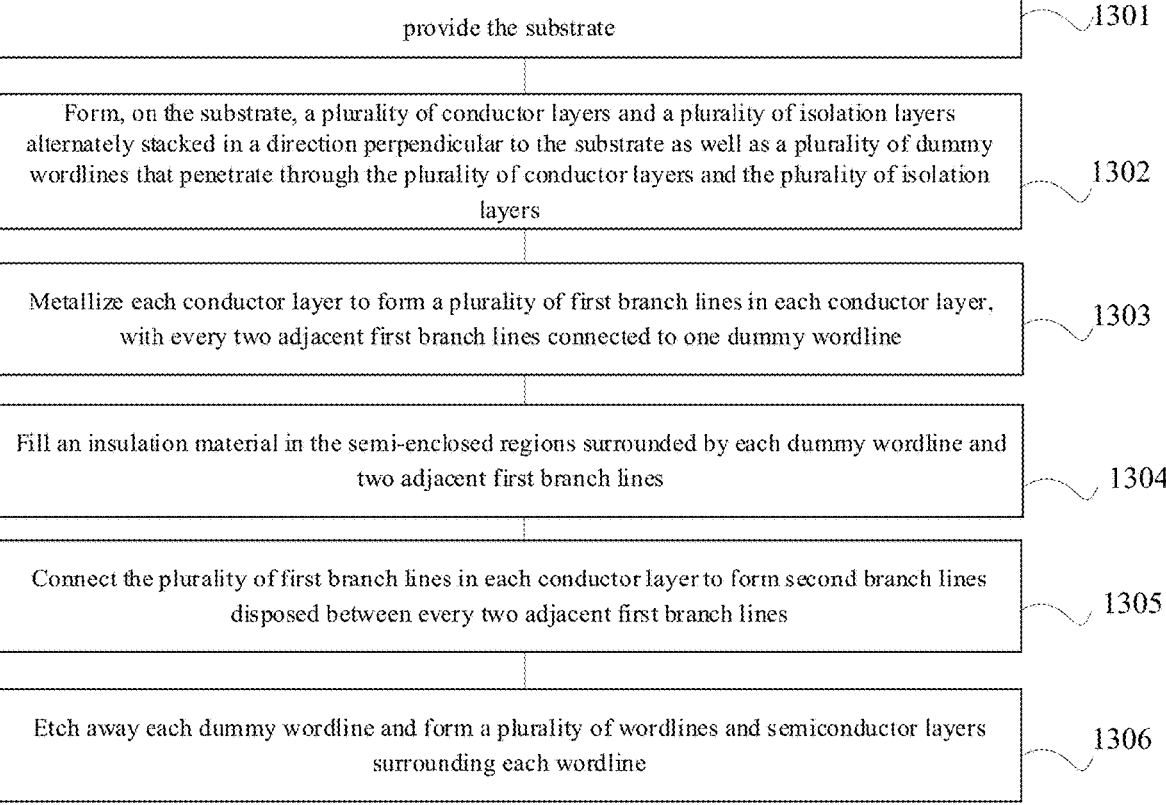

provide the substrate                                                          1301

Form, on the substrate, a plurality of conductor layers and a plurality of isolation layers
alternately stacked in a direction perpendicular to the substrate as well as a plurality of dummy
wordlines that penetrate through the plurality of conductor layers and the plurality of isolation
layers                                                                          1302

Metallize each conductor layer to form a plurality of first branch lines in each conductor layer,
with every two adjacent first branch lines connected to one dummy wordline          1303

Fill an insulation material in the semi-enclosed regions surrounded by each dummy wordline and
two adjacent first branch lines                                                  1304

Connect the plurality of first branch lines in each conductor layer to form second branch lines
disposed between every two adjacent first branch lines                           1305

Etch away each dummy wordline and form a plurality of wordlines and semiconductor layers
surrounding each wordline                                                        1306

FIG. 13

MEMORY, AND METHOD FOR MANUFACTURING MEMORY

This application is a U.S. national stage of international application No. PCT/CN2023/114102, filed on Aug. 21, 2023, which claims priority to Chinese Patent Application No. 202310298824.0, filed on Mar. 24, 2023, and entitled "MEMORY, METHOD FOR MANUFACTURING MEMORY, AND ELECTRONIC DEVICE", the disclosures of which are herein incorporated by reference in their entireties.

TECHNICAL FIELD

The embodiments of the present disclosure relate to the field of semiconductor technologies, and in particular, to a memory, and a method for manufacturing the memory.

BACKGROUND

With the development of integrated circuit technology, the critical dimensions of devices continue to shrink, and the variety and number of devices on a single chip are increased, which poses ever-greater challenges to device performance.

SUMMARY

Embodiments of the present disclosure provide a memory, and a method for manufacturing the memory.

According to some embodiments, a memory is provided. The memory includes one or more layers of memory cell arrays stacked in a direction perpendicular to a substrate, wherein each layer of the memory cell array includes a plurality of memory cells; a plurality of wordlines that penetrate through one or more layers of the memory cell arrays; and a plurality of bitlines, wherein each memory cell includes a semiconductor layer that surrounds a sidewall of the wordline and extends along the sidewall and each bitline connected to the semiconductor layers of a column of memory cells in one layer of the memory cell array, wherein the bitline includes a plurality of first branch lines and a plurality of second branch lines, with one second branch line connected between every two adjacent first branch lines; the semiconductor layer of each memory cell is connected to two adjacent first branch lines but is not connected to at least a part of a region of the second branch line between the two adjacent first branch lines.

In some embodiments, a region of the semiconductor layer between two adjacent first branch lines is disposed opposite to the second branch line between the two adjacent first branch lines.

In some embodiments, the second branch line includes all or part of a region of the bitline directly facing the semiconductor layer, and insulation material is filled between the region of the second branch line directly facing the semiconductor layer and the semiconductor layer; the insulation material is filled between the region of the semiconductor layer between the two adjacent first branch lines and the oppositely positioned second branch line.

In some embodiments, the wordline is disposed opposite to the second branch line, and there is an overlapping area between projections of the wordline surrounded by the semiconductor layer and the oppositely positioned second branch line on a plane perpendicular to the substrate, wherein the plane perpendicular to the substrate extends along a column direction of one column of memory cells.

In some embodiments, there is no overlapping area between projections of the wordline and the first branch line on the plane perpendicular to the substrate.

In some embodiments, each first branch line includes side surfaces and end surfaces, and the semiconductor layer is connected to at least one of the end surfaces and the side surfaces of two adjacent first branch lines, respectively.

In some embodiments, the second branch line is provided with a via hole penetrating through an upper surface and a lower surface or a hole on the upper surface, wherein a dielectric layer is filled within the via hole or the hole.

In some embodiments, each first branch line extends along the direction perpendicular to the substrate and exhibits a polygonal structure from a cross-sectional view along a plane parallel to the substrate, both ends of each second branch line are respectively connected to bending points of two adjacent first branch lines, and the semiconductor layer of each memory cell is connected to one end of two adjacent first branch lines, respectively.

In some embodiments, each memory cell further includes two first conductive layers connected respectively to the semiconductor layer and a second conductive layer connected to two first conductive layers, wherein a region of the semiconductor layer of each memory cell surrounded by two first conductive layers is disposed opposite to the second conductive layer, and an insulation material is filled between the region of the semiconductor layer of each memory cell surrounded by two adjacent first conductive layers and the second conductive layer.

In some embodiments, the second conductive layer extends in the direction perpendicular to the substrate and exhibits a U-shaped structure from a cross-sectional view along a plane parallel to the substrate, and both the first conductive layer and the second conductive layer include side surfaces and end surfaces, wherein the end surfaces of two first conductive layers of each memory cell are connected respectively to the two end surfaces of the second conductive layer.

In some embodiments, each memory cell further includes a third conductive layer connected to inner walls on both sides of the second conductive layer near the end surface.

In some embodiments, inner and outer walls of the U-shaped structure of the second conductive layer are respectively connected to a fourth conductive layer.

In some embodiments, each layer of the memory cell array includes a first column of memory cells and a second column of memory cells, and a plurality of bitlines include a first bitline and a second bitline, wherein the semiconductor layers in the first column of memory cells are connected to the first bitline, and the semiconductor layers in the second column of memory cells are connected to the second bitline; the first bitline and the second bitline are disposed between the first column of memory cells and the second column of memory cells, and the first bitline and the second bitline share one second branch line.

According to some embodiments, a memory is provided. The memory includes: one or more layers of transistor arrays stacked in a direction perpendicular to a substrate, wherein each layer of the transistor array includes a plurality of transistors; a plurality of wordlines that penetrate through one or more layers of the transistor arrays; and a plurality of bitlines, wherein each transistors includes a channel surrounding the wordline and a drain connected to the channel, and each bitline is connected to the drains of a column of transistors in one layer of the transistor array; wherein an insulation material is filled between a first channel region of the channel of each transistor and a first bitline region of the bitline, wherein the first channel region refers to a region of the channel directly facing the bitline, and the first bitline region refers to a region of the bitline directly facing the channel. It can be interpreted as that the second branch line includes all or part of a region of the bitline directly facing the semiconductor layer, and an insulation material is filled between the region of the second branch line directly facing the semiconductor layer and the semiconductor layer.

In some embodiments, the memory further includes a plurality of capacitors, and each transistor further includes a source connected to the channel, wherein the source of each transistor is connected to a first electrode of one capacitor, and insulation material is filled between a second channel region of the channel of each transistor and a first electrode region of the first electrode, wherein the second channel region refers to a region of the channel directly facing the first electrode, and the first electrode region refers to a region of the first electrode directly facing the channel.

In some embodiments, the first electrode is of a U-shaped structure, and an open end of the first electrode is connected to the source.

In some embodiments, the memory further includes a plurality of third conductive layers, wherein each third conductive layer is connected to inner walls on both sides of the first electrode near the open end.

In some embodiments, each bitline includes a plurality of first bitline segments and a plurality of second bitline segments, with one second bitline segment connected between every two adjacent first bitline segments; the first channel region of each transistor directly faces one second bitline segment.

According to some embodiments, a method for manufacturing a memory is provided, wherein the memory is the memory provided according to any one of the above embodiments, and the method includes: providing the substrate; forming, on the substrate, a plurality of conductor layers and a plurality of isolation layers alternately stacked in the direction perpendicular to the substrate as well as a plurality of dummy wordlines that penetrate through a plurality of the conductor layers and a plurality of the isolation layers; metallizing each conductor layer to form a plurality of the first branch lines in each conductor layer, with every two adjacent first branch lines connected to one dummy wordline; filling an insulation material in semi-enclosed regions surrounded by each dummy wordline and two adjacent first branch lines; connecting a plurality of the first branch lines in each conductor layer to form second branch lines disposed between every two adjacent first branch lines; and etching away each dummy wordline and forming a plurality of the wordlines and the semiconductor layers surrounding each wordline.

In some embodiments, the conductor layer is made of silicon; prior to metallizing the each conductor layer, the method further includes: etching a plurality of the conductor layers and a plurality of the isolation layers to form passages that penetrate through a plurality of the conductor layers and a plurality of the isolation layers and are disposed on both sides of each dummy wordline, with parts of each dummy wordline in the conductor layer exposed to the passages; and metallizing the each conductor layer to form the plurality of the first branch lines in the each conductor layer, with the every two adjacent first branch lines connected to the one dummy wordline, includes: depositing a metal film on an inner wall of the passage; and annealing the metal film to metallize the silicon on a surface of the conductor layer, resulting in a plurality of the first branch lines in each conductor layer.

In some embodiments, upon metallizing each conductor layer, two first conductive layers connected to each dummy wordline as well as a second conductive layer connected to two first conductive layers are further formed in each conductor layer, wherein the second conductive layer extends in the direction perpendicular to the substrate and exhibits a U-shaped structure from a cross-sectional view, and end faces of two first conductive layers connected to each dummy wordline are connected respectively to two end surfaces of one second conductive layer; connecting the plurality of the first branch lines in the each conductor layer to form the second branch lines disposed between the every two adjacent first branch lines, includes: etching a plurality of the conductor layers and a plurality of the isolation layers to form a plurality of first through holes that penetrate through a plurality of the conductor layers and a plurality of the isolation layers and are disposed between every two adjacent first branch lines, with an inner wall of the second conductive layer exposed; depositing a first metal layer on an inner wall of each first through hole and an inner wall of each second conductive layer near the first conductive layer; and etching the first metal layer disposed on each isolation layer and retaining the first metal layer disposed on each conductor layer to obtain a plurality of second branch lines and a plurality of third conductive layers disposed on each conductor layer.

In some embodiments, filling the insulation material in the semi-enclosed regions surrounded by the each dummy wordline and the two adjacent first branch lines, includes: etching a plurality of the conductor layers and a plurality of the isolation layers to form a plurality of second through holes that penetrate through a plurality of the conductor layers and a plurality of the isolation layers and are disposed in the semi-enclosed regions surrounded by each dummy wordline and two adjacent first branch lines, with both inner and outer walls of the second conductive layer exposed; etching away the silicon of each conductor layer in a plurality of the conductor layers; and depositing an insulation material in gaps between a plurality of the conductor layers and a plurality of the isolation layers after being etched, such that the insulation material is filled between the semi-enclosed regions surrounded by each dummy wordline and two adjacent first branch lines in each conductor layer as well as regions between each dummy wordline and two first conductive layers.

In some embodiments, etching away each dummy wordline and forming the plurality of the wordlines and the semiconductor layers surrounding each wordline, includes: etching away a plurality of the dummy wordlines to form a plurality of third through holes that penetrate through a plurality of the conductor layers and a plurality of the isolation layers; sequentially depositing a channel layer, a second dielectric layer, and a second metal layer on an inner wall of each third through hole to form a semiconductor layer, a gate insulating layer, and a plurality of the wordlines for each memory cell; and etching the channel layer disposed on each isolation layer to expose the second dielectric layer disposed on each isolation layer.

According to some embodiments, an electronic device is provided. The electronic device includes the memory provided according to any one of the above aspects.

In some embodiments, the electronic device includes a smart phone, a computer, a tablet, an artificial intelligence device, a wearable device, or a smart mobile terminal.

BRIEF DESCRIPTION OF THE DRAWINGS

To describe the technical solutions in the embodiments of the present disclosure more clearly, the following briefly describes the accompanying drawings required for describing the embodiments. Apparently, the accompanying drawings in the following description show merely some embodiments of the present disclosure, and a person of ordinary skill in the art may still derive other drawings from these accompanying drawings without creative efforts.

FIG. 12 is a structural schematic diagram of another memory improved based on the memory shown in FIG. 11 according to some embodiments of the present disclosure;

FIG. 13 is a flowchart of a method for manufacturing a memory according to some embodiments of the present disclosure;

REFERENCE NUMERALS

0. Substrate; 1. Memory cell; 2. Wordline; 3. Bitline; 31. First branch line; 32. Second branch line; 4. Transistor; 41. Semiconductor layer; 41'. Channel; 42. Drain; 43. First conductive layer; 43'. Source; 5. Capacitor; 51. Second conductive layer; 51'. First electrode; 52. Fourth conductive layer; 6. Third conductive layer; 100. Conductor layer; 200. Isolation layer; 300. Dummy wordline; 101. Passage; 102. Second through hole; 103. First metal layer; 104. First through hole; 105. First dielectric layer; 106. Silicon layer; 301. Channel layer; 302. Second dielectric layer; 303. Second metal layer.

DETAILED DESCRIPTION

For clearer descriptions of the objects, technical solutions, and advantages of the present disclosure, embodiments of the present disclosure are further described in detail below with reference to the accompanying drawings.

Before interpreting and explaining the embodiments of the present disclosure, the application scenario of the embodiments of the present disclosure needs to be clarified first. The embodiments disclosed herein can be used in the field of semiconductor technologies, specifically in the field of memories. Any product in the memory field that includes transistors with the following characteristics falls within the protection scope of the present disclosure. The characteristics of the transistor at least include: the channel is arranged horizontally, with wordlines or gates extending vertically and surrounded by a semiconductor layer; the bitline is connected to the semiconductor layer, and the extension directions of the wordlines and bitlines are perpendicular to each other; the bitline is connected to the semiconductor layer through two branches; and the insulating layer is arranged between the bitline and the semiconductor layer and is surrounded by the bitline and branches, which reduces the contact area between semiconductor layer and the bitline, thereby reducing the parasitic capacitance.

Figure 1:
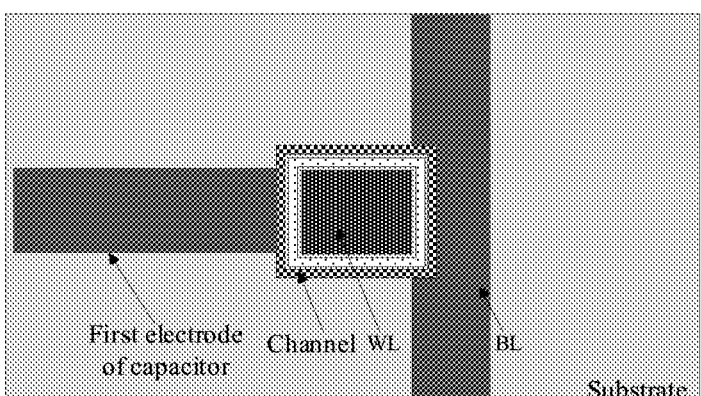
FIG. 1 is a schematic cross-sectional diagram of a memory cell in a 3D DRAM.

Take memory as an example, in dynamic random access memory (DRAM) including one or more layers of memory arrays, and each layer of memory array includes a plurality of memory cells. Regardless of whether the memory array is two-dimensional or 3D, or whether the memory cell is 1T or 2T, DRAM always exhibits a certain degree of parasitic capacitance, especially between bitlines and wordlines, or between the capacitor electrode and wordlines. For example, in a 1T1C memory cell of DRAM, the memory cell includes a transistor and a capacitor. As shown in FIG. 1, a wordline (WL) extends in a direction perpendicular to the substrate. The channel of the transistor surrounds the periphery of the WL. One side of the channel is connected to a first conductive pillar, which serves simultaneously as the source of the transistor and the first electrode of the capacitor. The other side of the channel is connected to a second conductive pillar, which serves simultaneously as the drain of the transistor and the bitline (BL). However, the parasitic capacitance between the WL and the BL in the structure shown in FIG. 1 can be further improved.

The embodiments disclosed herein are primarily illustrated using 3D DRAM as an example. As technology evolves, the miniaturization of DRAM has approached its limit. To achieve higher-density DRAM, 3D stacking is an important direction for development. 3D DRAM refers to stacking memory cells on a substrate to effectively reduce the cost of DRAM. 3D DRAM includes multiple layers of stacked memory cell arrays. Each layer of memory cell array includes a plurality of memory cells. These memory cells can be of various types, such as 1T1C, 1T0C, 2T1C, or 2T0C, which is not limited in the embodiments disclosed herein. A 2T0C memory cell includes two transistors, and data storage and read/write operation control are respectively accomplished through the gates of the two transistors. A 2T1C memory cell can be seen as a 2T0C memory cell with an added capacitor. However, the capacitor is not for storing data as 1 or 0 but for improving the degradation of the gate threshold voltage of the two transistors. Therefore, the 2T1C memory cell can also be seen as a different embodiment of the 2T0C memory cell. The capacitor in the memory provided according to the subsequent embodiments disclosed herein is the capacitor for storing data as 1 or 0. In addition, 1T1C-3D DRAM based on a horizontal channel surround structure greatly enhances the design flexibility of 3D DRAM due to the compatibility of channel material deposition technology with other processes. However, in such a type of memory, the parasitic capacitance between wordlines and bitlines, as well as between wordlines and the capacitor electrodes, needs to be further reduced. This reduction leads to a decrease in noise and signal interference caused by parasitic capacitance. Therefore, it is necessary to optimize the structure and fabrication process to ensure the stability and reliability of 3D DRAM during operation.

FIG. 1 is a schematic cross-sectional diagram of a memory cell in a 3D DRAM. As shown in FIG. 1, the channel directly facing the BL is entirely in direct contact with the BL, allowing for further improvement in the parasitic capacitance between the WL and the BL. In addition, the channel directly facing the first electrode of the capacitor is also entirely in direct contact with the first electrode, also allowing for further improvement in the parasitic capacitance between the WL and the first electrode of the capacitor. Based on this, the embodiments disclosed herein provide a memory, a method for manufacturing the memory, and an electronic device that aims at improving the parasitic capacitance of DRAM.

Figure 2:
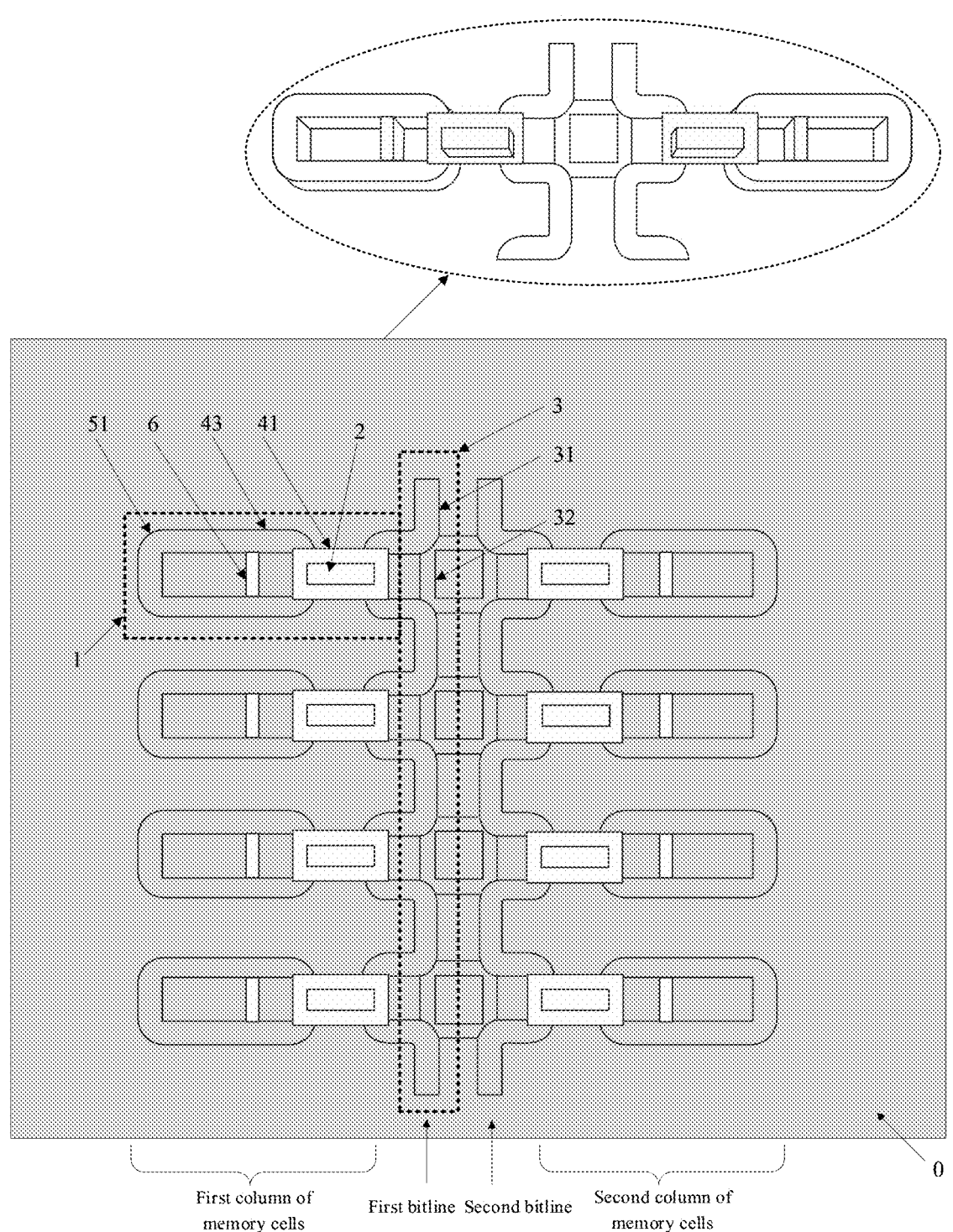
FIG. 2 is a structural schematic diagram of a memory according to some embodiments of the present disclosure.

FIGS. 2 to 8 show a type of memory that reduces the parasitic capacitance of DRAM according to some embodiments of the present disclosure. FIG. 2 is a structural schematic diagram of a memory according to some embodiments of the present disclosure. In FIG. 2, the lower diagram is a cross-sectional view of the memory cut along a plane parallel to the substrate 0, and the upper diagram is a three-dimensional view of the two memory cells in the first horizontal row depicted in the lower diagram. As shown in FIG. 2, in some embodiments, the memory includes one or more layers of memory cell arrays stacked in a direction perpendicular to the substrate 0, with FIG. 2 showing one layer of the memory cell array and each layer of the memory cell array including a plurality of memory cells 1; a plurality of wordlines 2 that penetrate through one or more layers of the memory cell arrays; each memory cell 1 including a semiconductor layer 41 that surrounds the sidewall of the wordline 2 and extends along the sidewall; and a plurality of bitlines 3, with each bitline 3 connected to the semiconductor layers 41 of a column of memory cells in one layer of the memory cell array. The bitline 3 includes a plurality of first branch lines 31 and a plurality of second branch lines 32, with one second branch line 32 connected between every two adjacent first branch lines 31. The semiconductor layer 41 of each memory cell 1 is connected to two adjacent first branch lines 31 but is not connected to at least a part of the region, between the two adjacent first branch lines 31, of the second branch line 32.

In the embodiments disclosed herein, the bitline includes a plurality of first branch lines and a plurality of second branch lines, with one second branch line connected between every two adjacent first branch lines. That is, the bitline is composed of different branch lines. Additionally, the semiconductor layer of each memory cell is connected to two adjacent first branch lines but is not connected to at least a part of the region, between the two adjacent first branch lines, of the second branch line. Compared to the channel of the memory cell in FIG. 1, which is directly connected to the conductive pillar serving as a bitline, the memory provided according to the embodiments disclosed herein reduces the contact area between the semiconductor layer of the memory cell and the bitline, thereby reducing the parasitic capacitance between the wordline and the bitline.

Figures 3, 4:
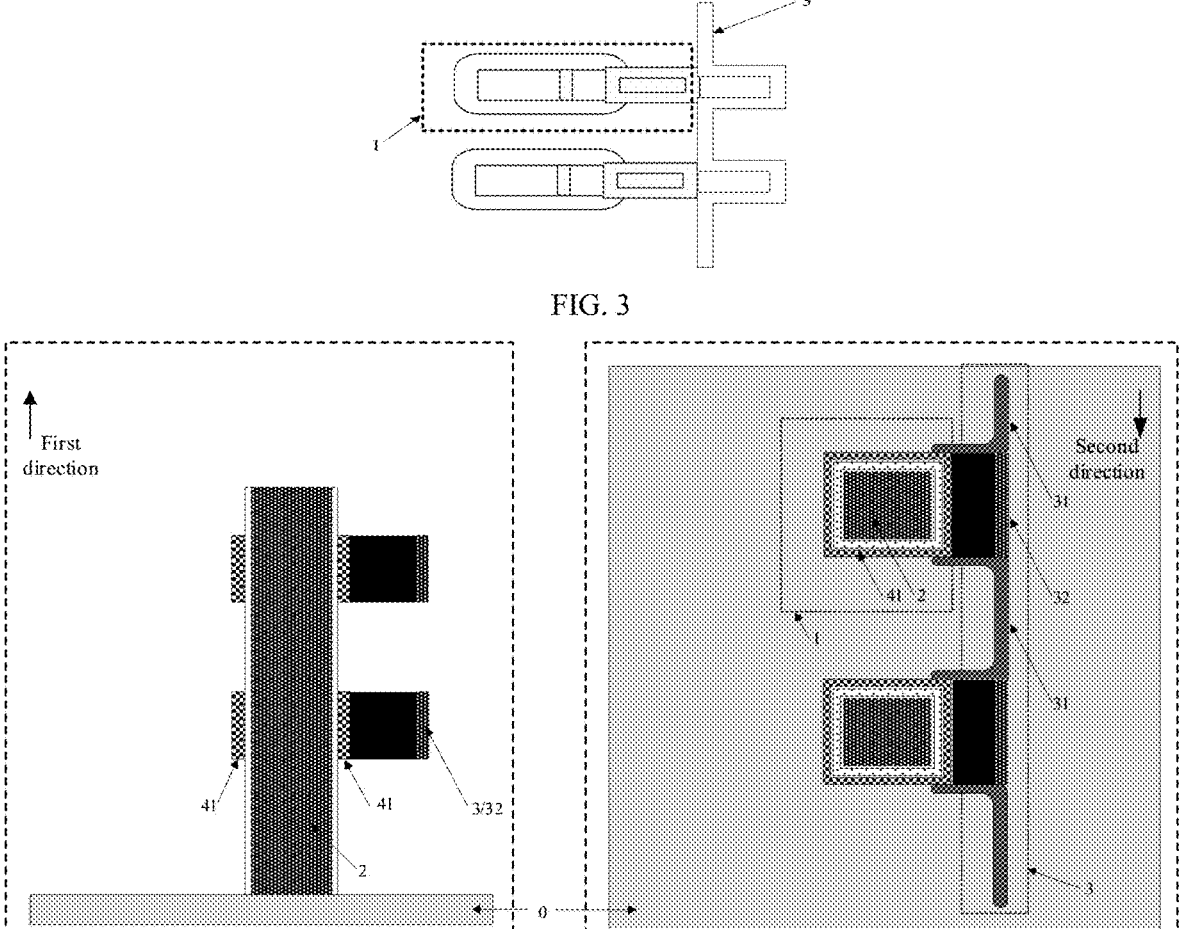
FIG. 3 is a schematic diagram of a bitline according to some embodiments of the present disclosure.
FIG. 4 is a structural schematic diagram of another memory according to some embodiments of the present disclosure.

In addition, the composition of the bitline from different branch lines can be understood in multiple ways. One interpretation is that the first and second branch lines are made from different materials. Another interpretation is that the first and second branch lines are formed separately from the same or different materials and then connected together. Such a configuration would reveal, upon analysis of the internal structure of the bitline in a cross-section parallel to the substrate, a discontinuity in stress on either side of the contact surface between the first and second branch lines. A further interpretation is that the bitline is made from the same material in an integrated manner, but the first and second branch lines have different orientations. For example, a bitline similar to what is shown in FIG. 3 is produced through an integrated process. In such a scenario, the vertical and horizontal branch lines close to the memory cell 1 in the bitline 3 are referred to as the first branch lines, and the vertical branch lines away from the memory cell 1 are referred to as the second branch lines.

Further, in some embodiments, as shown in FIG. 2 or 3, the region of the semiconductor layer 41 between two adjacent first branch lines 31 is disposed opposite to the second branch line 32 between the two adjacent first branch lines 31. In other words, the region of the semiconductor layer 41 of each memory cell 1 surrounded by two adjacent first branch lines 31 is disposed opposite to the second branch line 32 between the two adjacent first branch lines 31.

To further reduce the parasitic capacitance between the bitlines and wordlines, an insulation material is filled between the region of the semiconductor layer 41 between the two adjacent first branch lines 31 and the oppositely positioned second branch line 32. In other words, an insulation material is filled between the region of the semiconductor layer 41 of each memory cell 1 surrounded by two adjacent first branch lines 31 and the oppositely positioned second branch line 32.

In some embodiments, the second branch line includes all or part of the region the bitline directly facing the semiconductor layer, and the insulation material is filled between the region of the second branch line directly facing the semiconductor layer and the semiconductor layer. The method of filling with insulation material allows the semiconductor layer 41 of each memory cell 1 to be not entirely connected to the second branch line 32 between two adjacent first branch lines 31, which reduces the contact area between the semiconductor 41 and the bitline, thereby reducing the parasitic capacitance.

To facilitate understanding of the connections between various parts, the insulation material is not shown in FIGS. 2 and 3. FIG. 4 is a structural schematic diagram of another memory according to some embodiments of the present disclosure, where the black areas represent the filled insulation material. As shown in FIG. 4, the extension direction of each wordline 2 is referred to as the first direction, and the extension direction of each bitline 3 is referred to as the second direction. In FIG. 4, the left diagram is a cross-sectional view of one of the wordlines 2 along the first direction. As shown in the left diagram in FIG. 4, the wordline 2 extends along the first direction and is surrounded by a plurality of memory cells to form multiple layers of memory cell arrays stacked along the first direction perpendicular to the substrate. The right diagram in FIG. 4 is a cross-sectional view of one layer of memory cell array from the multiple layers of memory cell arrays. As shown in the right diagram in FIG. 4, a layer of memory cell array includes a plurality of memory cells 1, which is illustrated with 2 memory cells 1 as an example in the right diagram in FIG. 4. The plurality of memory cells 1 are arranged in a column along the second direction, and the semiconductor layers 41 of the plurality of memory cells 1 are connected to the same bitline 3. As shown in FIG. 4, an insulation material is filled between the region of the semiconductor layer 41 of each memory cell 1 surrounded by two adjacent first branch lines 31 and the oppositely positioned second branch line 32.

In some embodiments, the region of the semiconductor layer 41 of each memory cell 1 surrounded by two adjacent first branch lines 31 is disposed opposite to the second branch line 32 disposed between the two adjacent first branch lines 31. This can be interpreted as that the wordline 2 is disposed opposite to the second branch line 32, and there is an overlapping area between the projections of the wordline surrounded by the semiconductor layer 41 of each memory cell 1 and the oppositely positioned second branch line 32 on a plane perpendicular to the substrate 0. The plane perpendicular to the substrate 0 extends along the column direction of a column of memory cells. Exemplarily, as shown in FIGS. 2 to 4, the projection of the wordline surrounded by the semiconductor layer 41 of each memory cell 1 completely is overlapped with the projection of the oppositely positioned second branch line 32 on the plane perpendicular to the substrate 0. In this case, there is no overlapping area between the projections of the wordline 2 and the first branch line 31 on the plane perpendicular to the substrate 0.

In some embodiments, the projection of the wordline surrounded by the semiconductor layer 41 of each memory cell 1 is partially overlapped with the projection of the oppositely positioned second branch line 32 on the plane perpendicular to the substrate 0. Further examples are not detailed here.

In addition, in the embodiments disclosed herein, the first and second branch lines are named after the shape of the bitline 3 as shown in the cross-sectional views in FIGS. 2 and 3. In the memory according to the embodiments disclosed herein, the first and second branch lines are a conductive layer extending in a direction perpendicular to the substrate 0, that is, the first and second branch lines have a certain thickness in the direction perpendicular to the substrate 0 to ensure electrical connections with other parts. As shown in the left diagram in FIG. 4, the second branch line 32 extends a certain thickness along the first direction perpendicular to the substrate 0.

In some embodiments, as shown in FIG. 2, each first branch line 31 includes side surfaces and end surfaces, and the semiconductor layer 41 of each memory cell 1 is connected to the end surfaces of two adjacent first branch lines 31, respectively. For linear structures, the end surfaces typically refer to the surfaces at the two ends of the linear structure, and the side surfaces typically refer to the surfaces of the linear structure excluding the surfaces of the two ends. The area of the end surfaces is much smaller than that of the side surfaces. For example, for a cylinder of a linear structure, the end surfaces refer to the surfaces at the two ends of the cylinder, and the side surface refers to the surface of the cylindrical sidewall. As shown in FIG. 2, since the semiconductor layer 41 of memory cell 1 is connected to the end surfaces of the first branch lines 31, the part of the bitline that can form parasitic capacitance with the wordline 2 is only the end surface of the first branch line, which typically has a small area. As a result, the memory shown in FIG. 2 significantly reduces the parasitic capacitance between the wordline 2 and the bitline 3.

In some embodiments, as shown in FIG. 4, each first branch line 31 includes side surfaces and end surfaces, and the semiconductor layer 41 of each memory cell 1 is connected to the side surfaces of two adjacent first branch lines 31 near the end surfaces, respectively. In this case, the semiconductor layer 41 of the memory cell 1 is connected only to a small part of the side surface of the first branch line 31, which reduces the parasitic capacitance between the wordline 2 and the bitline 3 as well. In some embodiments, the semiconductor layer 41 of each memory cell 1 is connected to the end surfaces and the side surfaces near the end surfaces of two adjacent first branch lines 31.

In addition, in some embodiments, as shown in FIGS. 2 and 4, each first branch line 31 extends along the plane perpendicular to the substrate and exhibits a polygonal structure from a cross-sectional view along the plane parallel to the substrate, both ends of each second branch line 32 are respectively connected to the bending points of two adjacent first branch lines 31, and the semiconductor layer 41 of each memory cell 1 is connected to one end of two adjacent first branch lines 31, respectively. The semiconductor layer 41 of each memory cell 1 is connected to one end of two adjacent first branch lines 31 respectively, connected to the end faces of two adjacent first branch lines 31, or connected to the side surfaces of two adjacent first branch lines 31 near the end surfaces.

In some embodiments, each first branch line 31 is of other types of structures, such as arc-shaped, etc. Further examples are not detailed here.

In the memory shown in FIGS. 2 to 4, the semiconductor layer 41 surrounding the wordline 2 serves as the channel of the transistor in the memory cell, and the part of the first branch line connected to the semiconductor layer simultaneously serves as the drain of the transistor in the memory cell.

In addition, as shown in FIGS. 2 and 4, the semiconductor layer 41 of each memory cell 1 is connected to two adjacent first branch lines 31. In some embodiments, the semiconductor layer 41 of each memory cell 1 is further connected to a greater number of first branch lines 31, which is not limited in the embodiments disclosed herein.

For the memory shown in FIGS. 2 and 4, the bitline 3 is not fabricated in an integrated manner but is composed of alternating first branch lines 31 and second branch lines 32. This facilitates the process of filling insulation material between the region of the semiconductor layer 41 of each memory cell 1 surrounded by two adjacent first branch lines 31 and the oppositely positioned second branch line 32.

In addition, in the memory shown in FIGS. 2 and 4, in some embodiments, the first branch line 31 is made of metal silicide. This allows a plurality of first branch lines 31 to be fabricated in an integrated manner through a silicon metallization process during the manufacture of the memory. The spaced first branch lines 31 are then connected by the second branch lines 32 to form a complete bitline 3. Specific implementation can refer to subsequent manufacturing method embodiments, which will not be elaborated here.

In some embodiments, each second branch line is a straight line, and they are connected to form a continuous line. The continuous line is a conductive wire of a one-piece structure, which is a solid line. The conductive wire of a one-piece structure is connected to the first branch lines on the side. In some embodiments, the second branch lines 32 are independent of each other and are connected separately to the first branch lines 31 on the memory cells. In some embodiments, the first branch line 31 includes a branch extending laterally and a branch extending longitudinally (in the same direction as the bitline extends), with both branches being a one-piece structure and having a bending region formed by extending in different directions.

In some embodiments, one bitline is connected to at least one column of memory cells. In some embodiments, one bitline is connected simultaneously to two columns of memory cells. The second branch line 32 is of a hollow ring shape, with one second branch line 32 connected between every two adjacent first branch lines 31. A semiconductor layer corresponding to one memory cell is connected to two different first branch lines 31, and the first branch lines for two adjacent memory cells in a column are of a one-piece structure. The ring-shaped second branch line 32 is connected to the bending regions of two first branch lines corresponding to two columns of memory cells.

The first and second branch lines are of a one-piece structure made of the same material. Alternatively, the first and second branch lines are independent and interconnected structures made of different materials.

In some embodiments, as shown in FIG. 2, the conductive wire or conductive film layer corresponding to the second branch line 32 includes an upper surface and a lower surface parallel to the substrate. The second branch line 32 includes a via hole penetrating through the upper surface and the lower surface or a hole on the upper surface. A dielectric layer is filled within the via hole or the hole. This design facilitates the process of fabricating the second branch line 32 through the etching of via holes or holes. Specific implementation can refer to subsequent manufacturing method embodiments, which will not be elaborated here.

Figure 5:
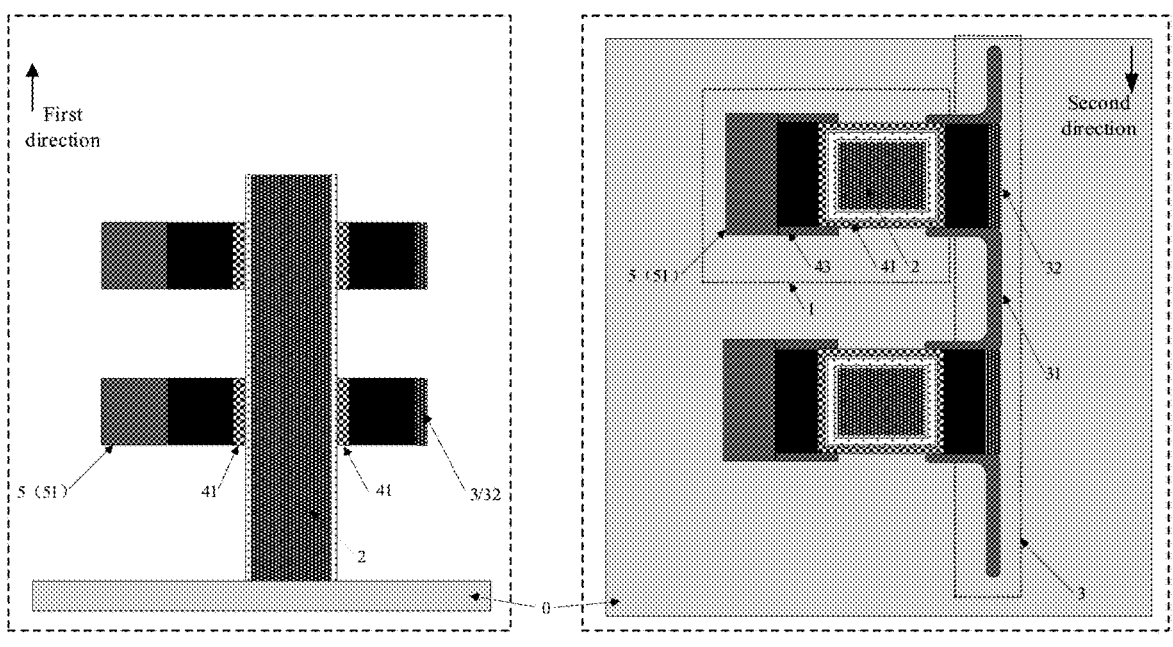
FIG. 5 is a structural schematic diagram of another memory improved based on the memory shown in FIG. 4 according to some embodiments of the present disclosure.
Figure 6:
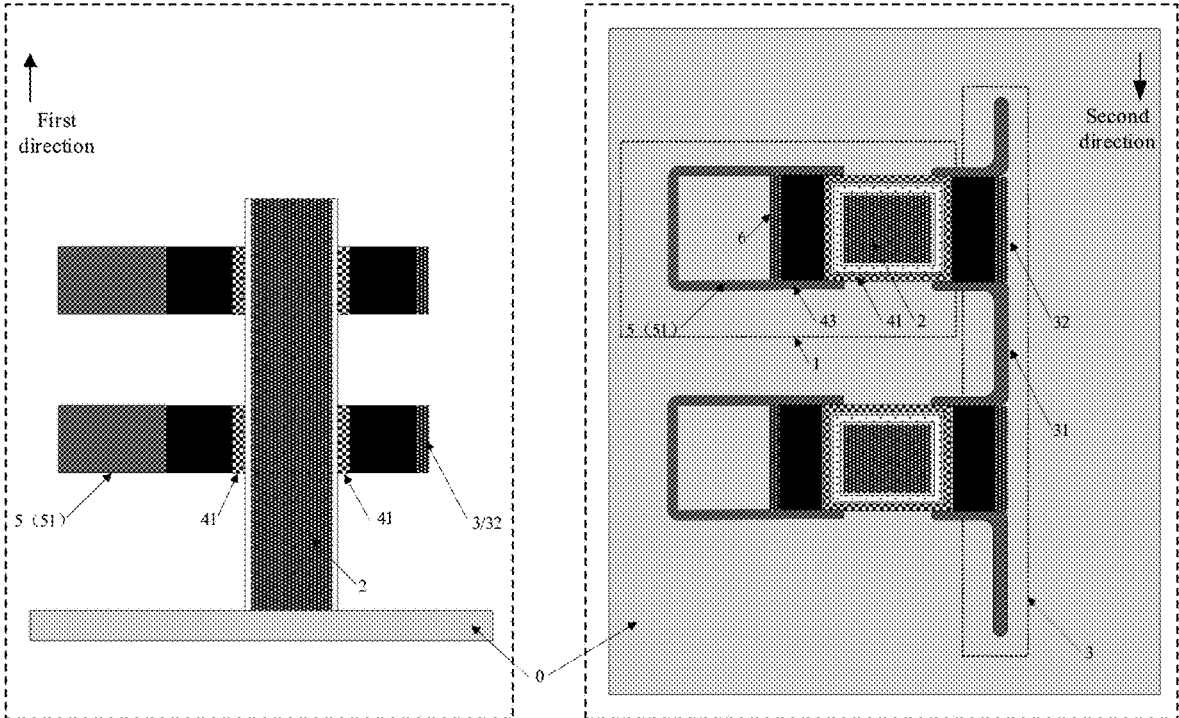
FIG. 6 is a structural schematic diagram of another memory improved based on the memory shown in FIG. 5 according to some embodiments of the present disclosure.
Figure 7:
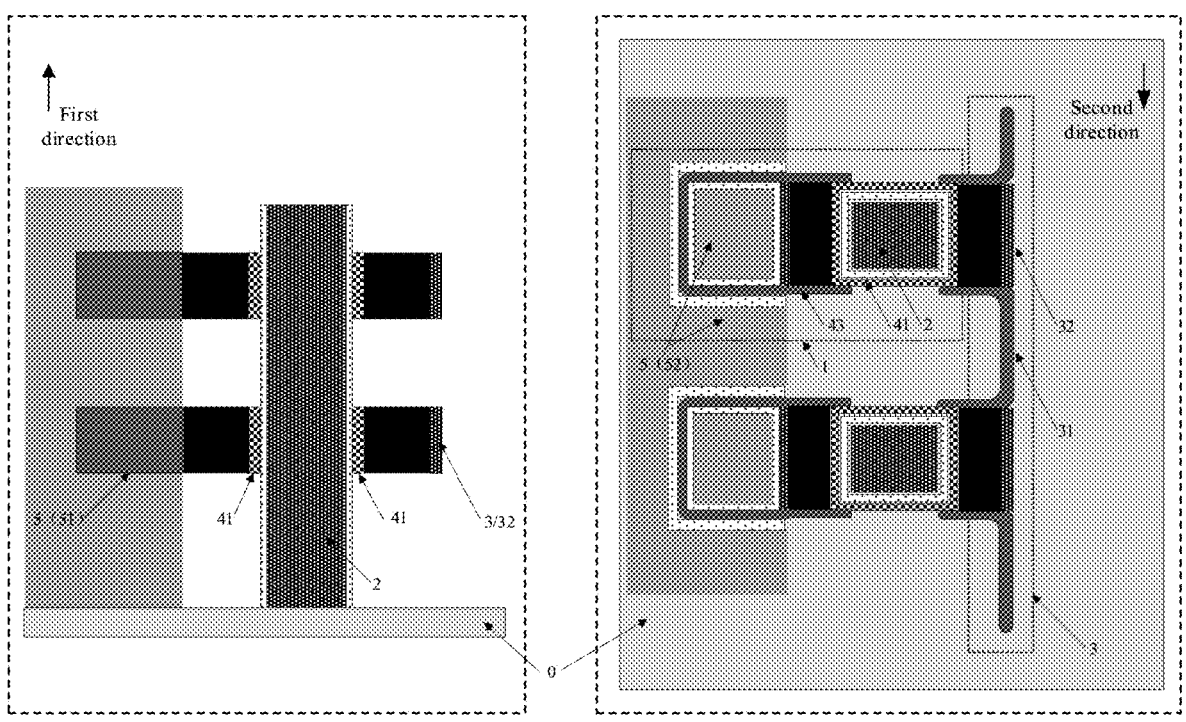
FIG. 7 is a structural schematic diagram of another memory improved based on the memory shown in FIG. 6 according to some embodiments of the present disclosure.

In some embodiments, for the memory with 1T1C memory cells, the structure shown in FIGS. 5 to 7 can also be referenced to reduce the parasitic capacitance between the wordline and the capacitor.

FIG. 5 is a structural schematic diagram of another memory improved based on the memory shown in FIG. 4 according to some embodiments of the present disclosure. As shown in FIG. 5, based on the memory shown in FIG. 4, each memory cell 1 further includes two first conductive layers 43 connected respectively to the semiconductor layer 41 and a second conductive layer 51 connected to the two first conductive layers 43. As shown in FIG. 5, the region of the semiconductor layer 41 of each memory cell 1 surrounded by the two first conductive layers 43 is disposed opposite to the second conductive layer 51. Additionally, an insulation material is filled between the region of the semiconductor layer 41 of each memory cell 1 surrounded by two adjacent first conductive layers 43 and the second conductive layer 51. As the insulation material is filled between the region of the semiconductor layer 41 of each memory cell 1 surrounded by two adjacent first conductive layers 43 and the second conductive layer 51, the parasitic capacitance between the WL and the capacitor is reduced.

In some embodiments, as shown in FIG. 5, the first conductive layer 43 includes side surfaces and end surfaces, and the second conductive layer 51 is connected to the end surface of the first conductive layer 43. The first conductive layer 43 serves as the source of the transistor in the memory cell. The second conductive layer 51 serves as the first electrode of the capacitor in the memory cell. For a film layer structure, the end surface typically refers to the surface of the film layer structure with a smaller area, and the side surface typically refers to the surface of the film layer structure with a larger area, such as the main surface. As shown in the right diagram in FIG. 5, since the end surface of the first conductive layer 43 of the memory cell 1 is connected to the second conductive layer 51, the part of the first electrode that can form parasitic capacitance with the wordline 2 is only the part of the first electrode that contacts the end surface of the first conductive layer 43. As the area of the end surface is usually small, the memory shown in FIG. 5 can significantly reduce the parasitic capacitance between the wordline 2 and the capacitor.

Exemplarily, as shown in FIG. 5, each memory cell 1 includes two first conductive layers 43, with the end surfaces of the two first conductive layers 43 connected respectively to the second conductive layer 51. In this case, the two first conductive layers 43 together serve as the source of a transistor. In some embodiments, each memory cell 1 further includes fewer or more first conductive layers 43, the number of which is not limited in the embodiments disclosed herein.

In addition, in the memory shown in FIG. 5, in some embodiments, both the first conductive layer 43 and the second conductive layer 51 are made of metal silicide. This allows the first conductive layer 43 and the second conductive layer 51 to be fabricated in an integrated manner through a silicon metallization process during the manufacture of the memory. Specific implementation can refer to subsequent manufacturing method embodiments, which will not be elaborated here.

In the memory shown in FIG. 5, there is no specific structure defined for the second conductive layer 51, i.e., the first electrode of the capacitor. In the memory shown in FIG. 5, the second conductive layer 51, i.e., the first electrode of the capacitor 5 can be of any structure, which is not limited in the embodiments disclosed herein.

In some embodiments, as shown in FIG. 6, based on the memory shown in FIG. 5, the second conductive layer 51 extends in a direction perpendicular to the substrate and exhibits a U-shaped structure from a cross-sectional view along the plane parallel to the substrate. The second conductive layer 51 includes side surfaces and end surfaces. The end surfaces of the two first conductive layers 43 of each memory cell 1 are connected respectively to the two end surfaces of the second conductive layer 51. With the U-shaped second conductive layer 51, the surface area of the first electrode of the capacitor 5 is increased, thereby enhancing the charge storage capacity of the memory cell.

Further, in some embodiments, the structure of the memory shown in FIG. 6 is modified to further increase the area of the first electrode of the capacitor 5. As shown in FIG. 6, each memory cell 1 further includes a third conductive layer 6 connected to the inner walls on both sides of the second conductive layer 51 near the end surface. The third conductive layer 6 also serves as the first electrode of the capacitor 5. In this case, the U-shaped second conductive layer 51 and the third conductive layer 6 form a ring-shaped electrode, which serves as the first electrode of the capacitor 5. In the memory shown in FIG. 6, there is no specific structure defined for the second electrode of the capacitor. In the memory shown in FIG. 6, the second electrode of the capacitor can be of any structure, which is not limited in the embodiments disclosed herein.

In some embodiments, as shown in FIG. 7, based on the memory shown in FIG. 6, the inner and outer walls of the U-shaped structure of the second conductive layer 51 are respectively connected to a fourth conductive layer 52. The two parts of the fourth conductive layer 52, which are connected respectively to the inner and outer walls of the U-shaped structure of the second conductive layer 51, serve as the second electrode of the capacitor 5. In this case, the first electrode of the capacitor is of a ring-shaped structure, and the second electrode of the capacitor is not just one part but includes two parts, which are disposed respectively on the inner side and outer side of the ring-shaped first electrode.

In addition, as shown in the left diagram in FIG. 7, the same material as the fourth conductive layer 52 is also filled in the region between the memory arrays of different layers and between the upper and lower surfaces of the capacitor 5. This allows the two parts of the fourth conductive layer 52 on the inner and outer walls of the second conductive layer 51 shown in the right diagram in FIG. 7 to be connected together. In addition, in the right cross-sectional diagram in FIG. 7, a first dielectric layer is distributed between the first electrode (i.e., second conductive layer 51) and the second electrode (i.e., fourth conductive layer 52) of the capacitor 5, serving as the dielectric layer of the capacitor 5. The first dielectric layer is disposed on both sides of the inner and outer walls of the first electrode.

FIGS. 4 to 7 illustrate an example where each layer of the memory cell array includes a column of memory cells. In some embodiments, as shown in FIG. 2, each layer of the memory cell array includes more columns of memory cells. Exemplarily, as shown in FIG. 2, each layer of the memory cell array includes a first column of memory cells and a second column of memory cells, and the plurality of bitlines 3 include a first bitline and a second bitline. The semiconductor layers 41 of the first column of memory cells are connected to the first bitline, and the semiconductor layers 41 of the second column of memory cells are connected to the second bitline. Moreover, the first bitline and the second bitline are disposed between the first column of transistors and the second column of transistors. That is, the first column of memory cells and the second column of memory cells are arranged in a mirrored layout. In this case, the first bitline and the second bitline can also be connected to allow the first column of memory cells and the second column of memory cells to share the same bitline, facilitating subsequent control of the first bitline and the second bitline.

In some embodiments, as shown in FIG. 2, each second branch line 32 in the first bitline is connected to a second branch line 32 in the second bitline. Further, the first bitline and the second bitline share the second branch line, facilitating the process of fabricating the second branch line 32. Specific implementation can refer to subsequent manufacturing method embodiments, which will not be elaborated here. FIG. 2 illustrates an example where each layer of the memory cell array includes two columns of memory cells. In some embodiments, each layer of the memory cell array includes more columns of memory cells. Further examples are not detailed here.

Figure 8:
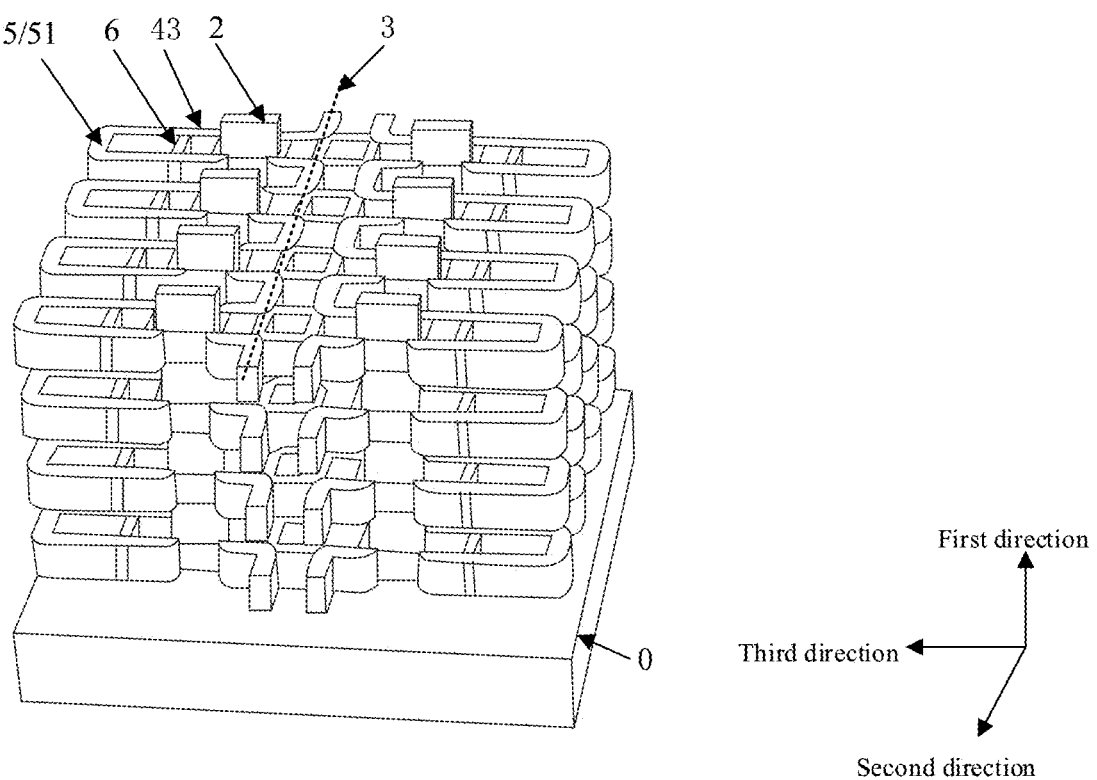
FIG. 8 is a three-dimensional view of the memory cell array shown in FIG. 2 after being stacked in a multi-layer manner.

When the layer of memory cell array shown in FIG. 2 is stacked in a multi-layer manner, a type of 3D DRAM according to the embodiments disclosed herein can be obtained. FIG. 8 is a three-dimensional view of the memory cell array shown in FIG. 2 after being stacked in a multi-layer manner. As shown in FIG. 8, a plurality of wordlines 2 are arranged in an array along the second direction and the third direction on the substrate 0. Multiple layers of memory cell arrays are stacked along the first direction on the substrate 0. Each layer of memory cell array includes two columns of memory cells arranged in a mirrored layout, each column of memory cells including a plurality of memory cells 1 arranged along the second direction (reference numeral 1 is not shown in FIG. 8). The semiconductor layer 41 of each memory cell 1 in every column of memory cells is connected to the first branch line 31 of the bitline 3, with the specific connection method referring to the relevant content shown in FIG. 2. The semiconductor layer 41 serves as the channel of the transistor, with the part of the first branch line 31 near the semiconductor layer 41 simultaneously serving as the drain of the transistor. The end surface of the first conductive layer 43 of each memory cell 1 in every column of memory cells is connected to a U-shaped second conductive layer 51, with the first conductive layer 43 serving as the source of the transistor in the memory cell, and the second conductive layer serving as the first electrode of the capacitor in the memory cell.

Figure 9:
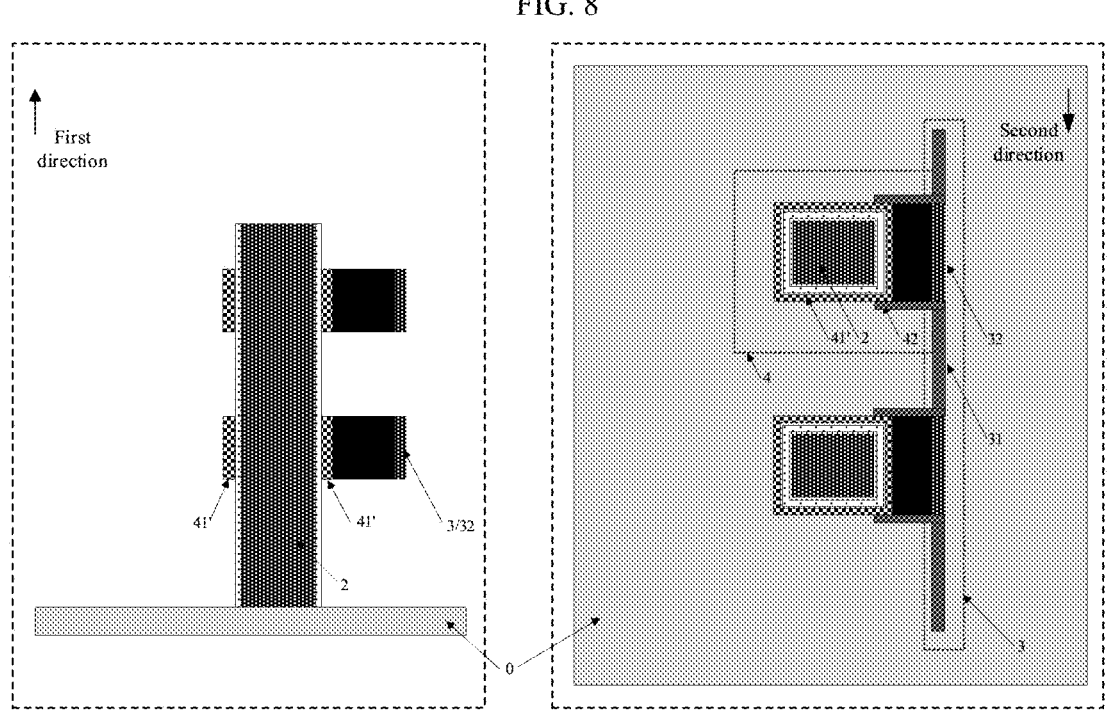
FIG. 9 is a structural schematic diagram of another memory according to some embodiments of the present disclosure that reduces parasitic capacitance.

FIGS. 9 to 12 illustrate another type of memory according to some embodiments of the present disclosure to reduce the parasitic capacitance of DRAM. A detailed explanation is provided below. FIG. 9 is a structural schematic diagram of another memory according to some embodiments of the present disclosure that reduces parasitic capacitance. As shown in FIG. 9, in some embodiments, the memory includes one or more layers of transistor arrays stacked in a direction perpendicular to the substrate 0, with each layer of the transistor array including a plurality of transistors 4; a plurality of wordlines 2 that penetrate through one or more layers of the transistor arrays; each transistor 4 including a channel 41' surrounding the wordline 2 and a drain 42 connected to the channel 41'; and a plurality of bitlines 3, with each bitline 3 connected to the drains 42 of a column of transistors in one layer of the transistor array. Specifically, as shown in FIG. 9, a plurality of wordlines 2 are arranged in the second direction, and a plurality of bitlines 3 are arranged in the first direction; multiple layers of the transistor array are stacked in the first direction on the substrate 0, each layer of the transistor array including a column of transistors 4 arranged in the second direction. The channels 41 of multiple transistors 4 arranged along the first direction in different layers of the transistor arrays surround the same wordline 2, and the drains 42 of a column of transistors 4 in the same layer of the transistor array are connected to the same bitline 3.

In the embodiments disclosed herein, as shown in FIG. 9, an insulation material is filled between the first channel region of the channel 41' of the transistor 4 and the first bitline region of the bitline 3. The first channel region refers to the region of the channel 41' directly facing the bitline 3, and the first bitline region refers to the region of the bitline 3 directly facing the channel 41'. This arrangement reduces the parasitic capacitance between the wordline and the bitline.

The first channel region refers to the region of the channel 41' directly facing the bitline 3, which can be interpreted as that all or part of the sidewall area of the channel 41' that can be seen from the bitline 3 along the third direction is referred to as the first channel region. Alternatively, it can be interpreted as that all or part of the sidewall area of the channel 41' onto which the bitline 3 can be projected along the third direction is referred to as the first channel region. The first bitline region refers to the region of the bitline 3 directly facing the channel 41', which can be interpreted as that all or part of the bitline area that can be seen from the channel 41' along the third direction is referred to as the first bitline region. Alternatively, it can be interpreted as that all or part of the side surface area of the bitline 3 onto which the channel 41' can be projected along the third direction is referred to as the first bitline region. As shown in FIG. 9, since the insulation material is filled between the first channel region of the channel 41' of the transistor 4 and the first bitline region of the bitline 3, not all of the first channel region and the first bitline region are directly electrically connected. This reduces the contact area between the channel 41' and the bitline 3, thereby avoiding a large parasitic capacitance between the wordline and the bitline that would result from a direct and complete electrical connection between the first channel region and the first bitline region.

In addition, in the memory shown in FIG. 9, the drain 42 of each transistor 4 is composed of two semiconductor layers. In this case, the filling of the insulation material between the first channel region of the channel 41' of the transistor 4 and the first bitline region of the bitline 3 can also be interpreted as the insulation material being filled within the semi-enclosed area surrounded by the drain 42 and channel 41' of the transistor 4.

In addition, in some embodiments, as shown in FIG. 9, the bitline 3 includes a plurality of first branch lines 31 and a plurality of second branch lines 32, with one second branch line 32 connected between every two first branch lines 31. The first channel region directly faces a second branch line 32. With the above arrangement, each branch line can be fabricated in segments, and then these branch lines are connected to form a complete bitline. This facilitates the initial fabrication of the drain and the first branch lines, followed by filling the insulation material at the corresponding positions, and finally connecting all the first branch lines together to form a complete bitline.

In this case, exemplarily, both the drain 42 and the first branch line 31 are made of metal silicide. This allows the drain 42 and the first branch line 31 to be fabricated in an integrated manner through a silicon metallization process during the manufacture of the memory. Specific implementation can refer to subsequent manufacturing method embodiments, which will not be elaborated here.

In some embodiments, for the memory with 1T1C memory cells, the structure shown in FIG. 9 can also be referenced to reduce the parasitic capacitance between the wordline and the capacitor.

Figure 10:
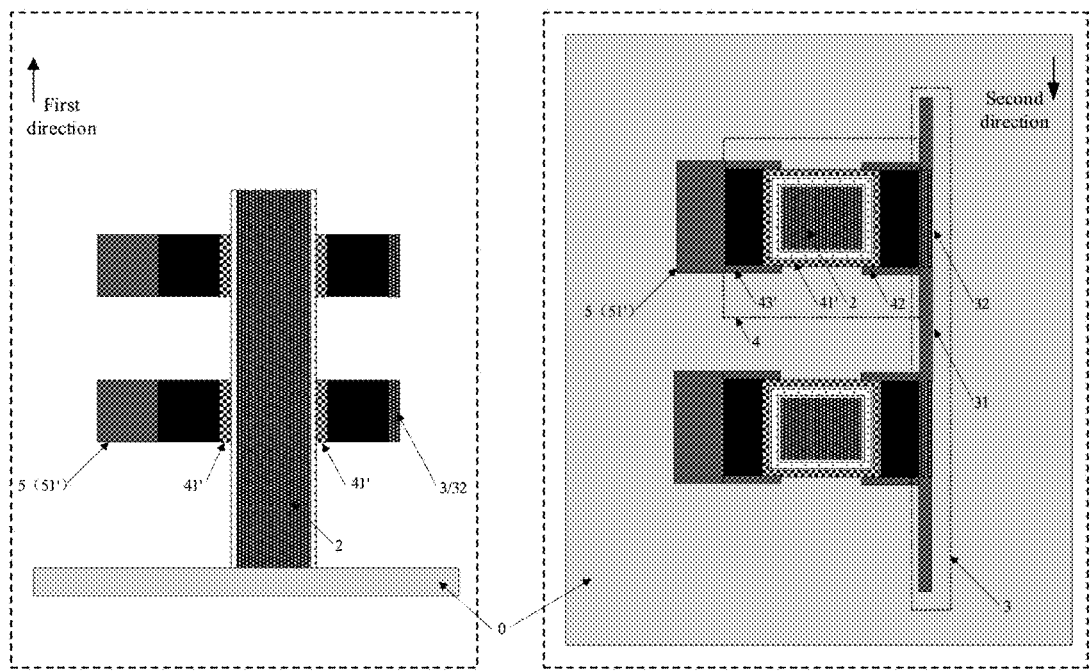
FIG. 10 is a structural schematic diagram of another memory improved based on the memory shown in FIG. 9 according to some embodiments of the present disclosure.

FIG. 10 is a structural schematic diagram of another memory improved based on the memory shown in FIG. 9 according to some embodiments of the present disclosure. As shown in FIG. 10, based on the memory shown in FIG. 9, the memory further includes a plurality of capacitors 5. Each transistor 4 further includes a source 43' connected to the channel 41'. The source 43' of each transistor 4 is connected to the first electrode 51' of the capacitor 5, and an insulation material is filled between the second channel region of the channel 41' and the first electrode region of the first electrode 51'. The second channel region refers to the region of the channel 41' directly facing the first electrode 51', and the first electrode region refers to the region of the first electrode 51' directly facing the channel 41'.

The second channel region refers to the region of the channel 41' directly facing the first electrode 51', which can be interpreted as that all or part of the sidewall area of the channel 41' that can be seen from the first electrode 51' along the third direction is referred to as the second channel region. Alternatively, it can be interpreted as that all or part of the sidewall area of the channel 41' onto which the first electrode 51' can be projected along the third direction is referred to as the second channel region. The first electrode region refers to the region of the first electrode 51' directly facing the channel 41', which can be interpreted as that all or part of the first electrode 51' area that can be seen from the channel 41' along the third direction is referred to as the first electrode region. Alternatively, it can be interpreted as that all or part of the side surface area of the first electrode 51' onto which the channel 41' can be projected along the third direction is referred to as the first electrode region.

As shown in FIG. 10, since the insulation material is filled between the second channel region of the channel 41' of the transistor 4 and the first electrode region of the first electrode 51', not all of the second channel region and the first electrode region are directly electrically connected. This reduces the contact area between the channel 41' and the first electrode 51', thereby avoiding a large parasitic capacitance between the wordline and the bitline that would result from a direct and complete electrical connection between the second channel region and the first electrode region.

In addition, in the memory shown in FIG. 10, the source 43' of each transistor 4 is composed of two semiconductor layers. In this case, the filling of the insulation material between the second channel region of the channel 41' of the transistor 4 and the first electrode region of the first electrode 51' can also be interpreted as the insulation material being filled within the semi-enclosed area surrounded by the source 43' and channel 41' of the transistor 4.

In addition, in the memory shown in FIG. 10, in some embodiments, both the source 43' and the first electrode 51' are made of metal silicide. This allows the source 43' and the first electrode 51' to be fabricated in an integrated manner through a silicon metallization process during the manufacture of the memory. Specific implementation can refer to subsequent manufacturing method embodiments, which will not be elaborated here.

In the memory shown in FIG. 10, there is no specific structure defined for the second conductive layer, i.e., the first electrode 51' of the capacitor 5. In the memory shown in FIG. 10, the first electrode 51' of the capacitor 5 can be of any structure, which is not limited in the embodiments disclosed herein.

Figure 11:
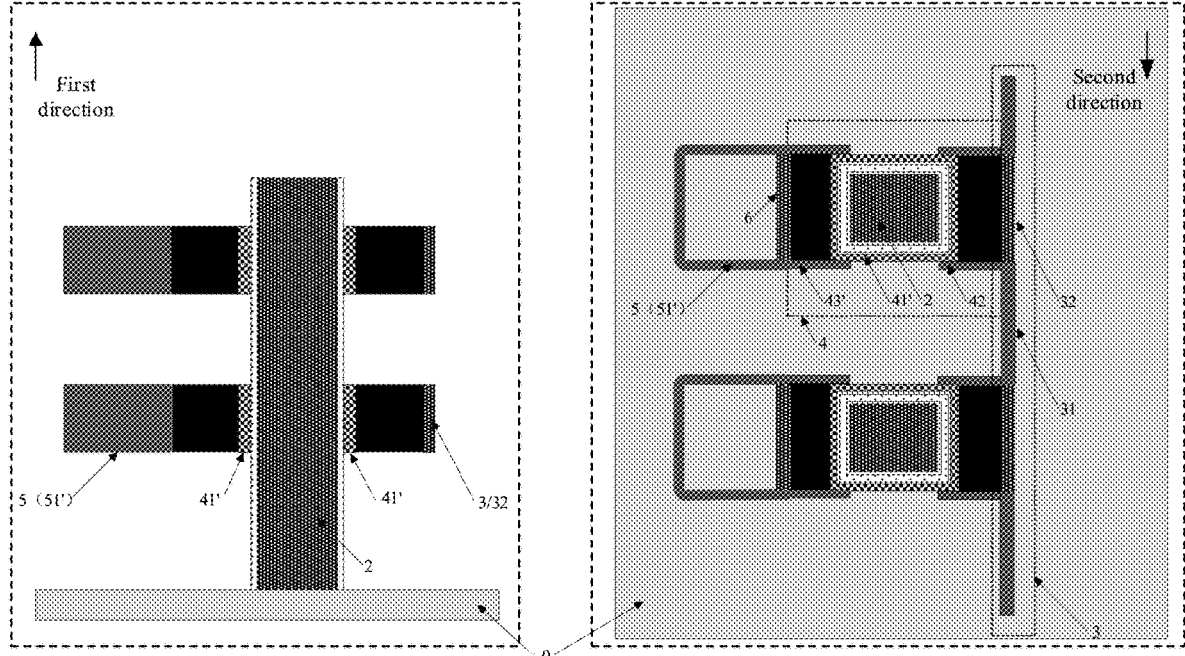
FIG. 11 is a structural schematic diagram of another memory improved based on the memory shown in FIG. 10 according to some embodiments of the present disclosure.

In some embodiments, as shown in FIG. 11, based on the memory shown in FIG. 10, the first electrode 51' is of a U-shaped structure, and the open end of the first electrode 51' is connected to the source 43'. With the U-shaped first electrode 51', the surface area of the first electrode 51' of the capacitor is increased, thereby enhancing the charge storage capacity of the memory cell composed of the transistor and the capacitor. The aforementioned first electrode 51' is also referred to as the first electrode of the capacitor.

Further, in some embodiments, the structure of the memory shown in FIG. 11 is modified to further increase the area of the first electrode of the capacitor. As shown in FIG. 11, the memory further includes a plurality of third conductive layers 6; each third conductive layer 6 is connected to the inner walls on both sides of a first electrode 51' near the open end. The third conductive layer 6 also serves as the first electrode of the capacitor. In this case, the U-shaped first electrode 51' and the third conductive layer 6 form a ring-shaped electrode, which serves as the first electrode of the capacitor.

In some embodiments, the specific structure of the first electrode of the capacitor is not defined, and the first electrode of the capacitor can be of any structure.

In addition, the relevant content for the second electrode of the capacitor can refer to the content related to FIG. 7, which will not be reiterated here.

FIGS. 9 to 11 illustrate an example where each layer of the memory cell array includes a column of memory cells. In some embodiments, each layer of the memory cell array includes more columns of memory cells. FIG. 12 is a structural schematic diagram of another memory improved based on the memory shown in FIG. 11 according to some embodiments of the present disclosure. As shown in FIG. 12, each layer of the transistor array includes a first column of transistors and a second column of transistors, and the plurality of bitlines 3 include a first bitline and a second bitline. The drains 42 of the first column of transistors are connected to the first bitline, and the drains 42 of the second column of transistors are connected to the second bitline. The first bitline and the second bitline are disposed between the first column of transistors and the second column of transistors. That is, the first column of transistors and the second column of transistors are arranged in a mirrored layout. In this case, the first bitline and the second bitline can also be connected to allow the first column of transistors and the second column of transistors to share the same bitline, facilitating subsequent control of the first bitline and the second bitline.

In some embodiments, as shown in FIG. 12, where each bitline 3 includes both first branch lines 31 and second branch lines 32, a second branch line 32 in the first bitline and a second branch line 32 in the second bitline are the same second branch line, facilitating the process of fabricating the second branch line 32. Specific implementation can refer to subsequent manufacturing method embodiments, which will not be elaborated here.

Regarding the three-dimensional view of the memory shown in FIG. 12 in the context of 3D DRAM, reference can also be made to FIG. 8, which will not be reiterated here.

Next, the method for manufacturing the memory according to the embodiments disclosed herein will be explained in detail. FIG. 13 is a flowchart of a method for manufacturing the memory according to some embodiments of the present disclosure. As shown in FIG. 13, the method includes the following steps.

Step 1301: providing a substrate 0.

In some embodiments, the substrate 0 is made of silicon. Exemplarily, the substrate is made of monocrystalline silicon.

Step 1302: forming, on the substrate 0, a plurality of conductor layers 100 and a plurality of isolation layers 200 alternately stacked in a direction perpendicular to the substrate 0 as well as a plurality of dummy wordlines 300 that penetrate through the plurality of conductor layers 100 and the plurality of isolation layers 200.

In some embodiments, the method for implementing Step 1302 is as follows: depositing a plurality of isolation layers 200 and a plurality of conductor layers 100 alternately on the substrate 0 along the first direction to obtain the structure shown in FIG. 14; etching the plurality of isolation layers 200 and the plurality of conductor layers 100 to form fourth through holes that penetrate through the plurality of isolation layers 200 and the plurality of conductor layers 100 and extend along the first direction; and depositing an insulation material in each fourth through hole to obtain a plurality of dummy wordlines 300, resulting in the structure shown in FIG. 15.

The first direction is perpendicular to the substrate 0. The dummy wordline 300 is also labeled as dummy WL. The c1, c2, and c3 in FIGS. 14 and 15 represent cross-sectional views obtained along the three directions shown in FIG. 14. Reference may be made to this explanation for c1, c2, and c3 in subsequent figures.

It should be noted that dummy wordlines refer to structures that will be sacrificed later to form the actual wordlines, hence dummy wordlines are also referred to as sacrificial wordlines.

Figures 14, 15:
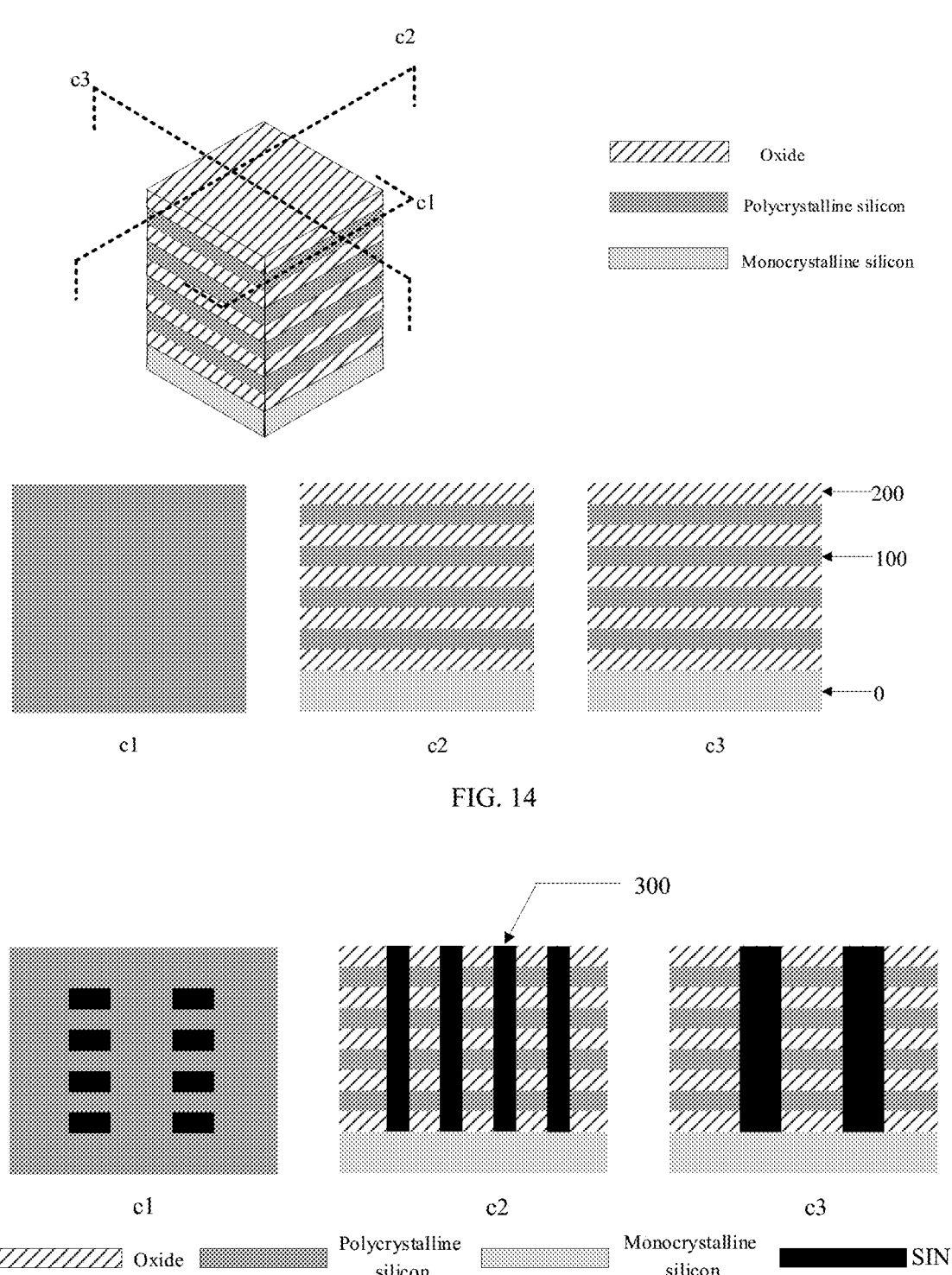
FIG. 14 is a structural schematic diagram of stacked layers according to some embodiments of the present disclosure.
FIG. 15 is a structural schematic diagram of the dummy wordlines formed in the stacked layers according to some embodiments of the present disclosure.

Exemplarily, as shown in FIGS. 14 and 15, the isolation layer 200 is made of oxide, which is an insulation material. The conductor layer 100 is made of polycrystalline silicon (poly). The dummy wordline 300 is made of SiN, which is also an insulation material. The dummy wordline 300 is made of SiN to facilitate subsequent operations. In some embodiments, the dummy wordline 300 is also made of other materials.

In addition, after the plurality of isolation layers 200 and the plurality of conductor layers 100 are alternately stacked in FIG. 14, a layer of mask (hard mask) is further deposited on the topmost isolation layer 200 to facilitate subsequent etching operations. The mask is made of SiN or other mask materials.

In addition, for ease of subsequent explanations, the plurality of isolation layers 200 and the plurality of conductor layers 100 alternately deposited are simply referred to as the stacked layers.

Step 1303: metallizing each conductor layer 100 to form a plurality of first branch lines 31 in each conductor layer 100, with every two adjacent first branch lines 31 connected to one dummy wordline 300.

In some embodiments, the conductor layer 100 is made of silicon. In this case, prior to metallizing each conductor layer 100, as shown in FIGS. 16 and 17, the plurality of conductor layers 100 and the plurality of isolation layers 200 are first etched to form passages 101 that penetrate through the plurality of conductor layers 100 and the plurality of isolation layers 200 and are disposed on both sides of each dummy wordline 300, with the parts of each dummy wordline 300 in the conductor layer 100 exposed to the passages 101.

Figure 16:
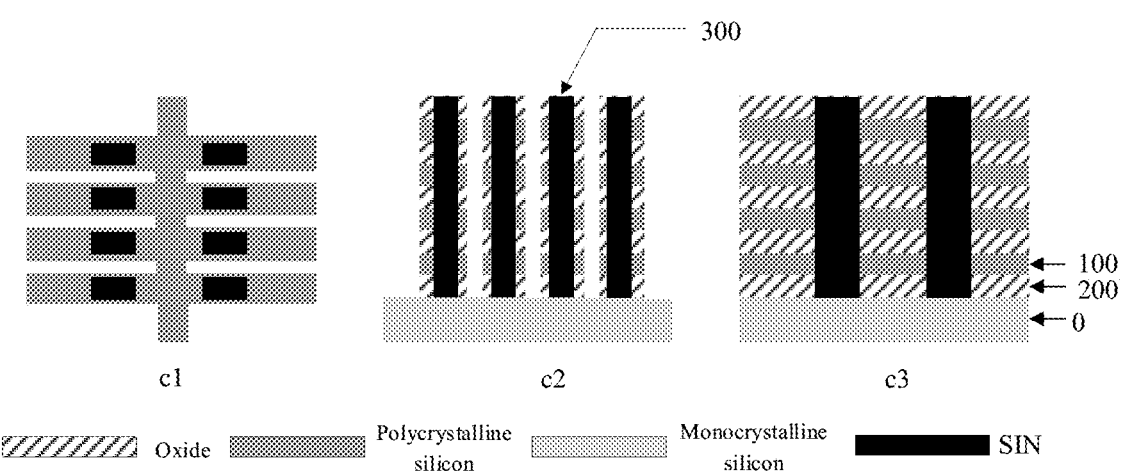
FIG. 16 is a structural schematic diagram of the etched dummy wordlines according to some embodiments of the present disclosure.
Figure 17:
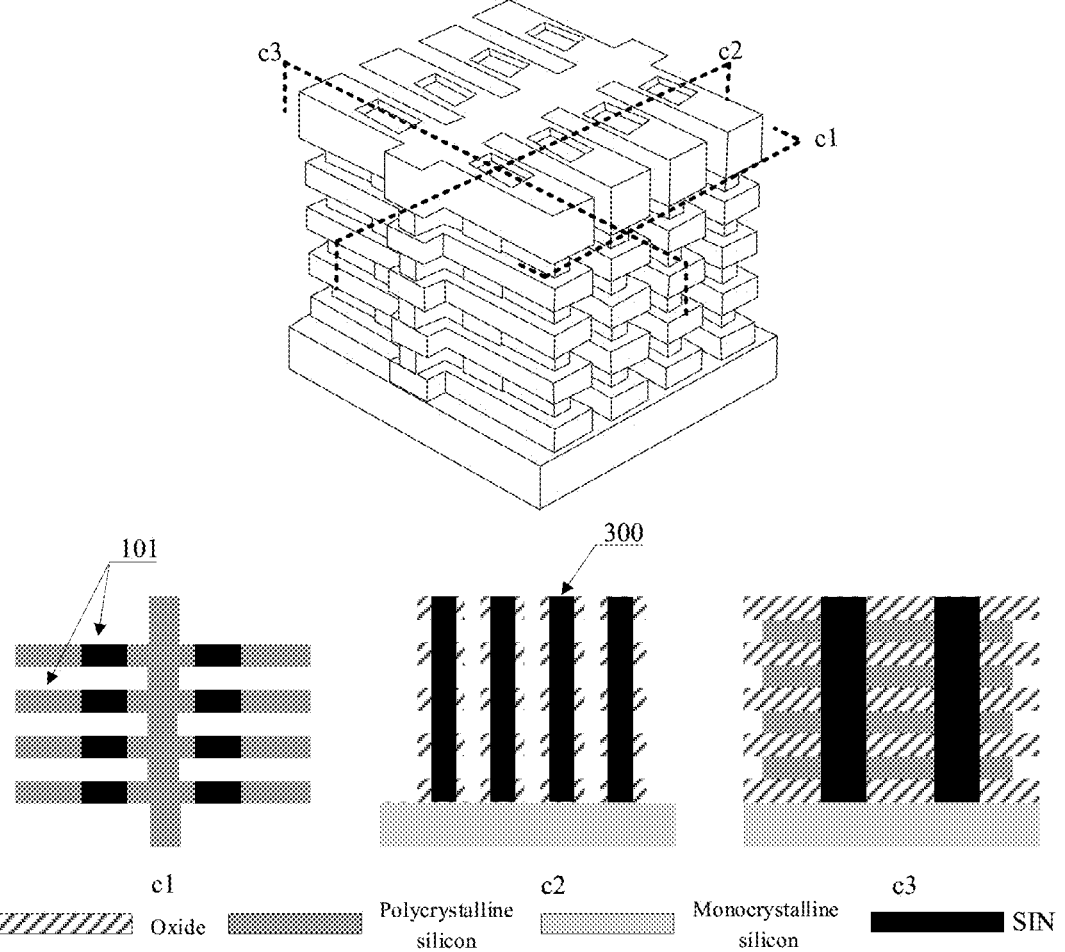
FIG. 17 is a structural schematic diagram of the etched passages according to some embodiments of the present disclosure.

The specific process for forming the structure shown in FIG. 16 is as follows: first etching the mask, then etching the stacked layers through the etched mask to form the initial passages on both sides of each dummy wordline 300 as shown in FIG. 16. It should be noted that at this point, the sidewalls of the dummy wordlines in the conductor layer 100 are not yet exposed. Then, the conductor layer is etched through the isotropic etching method to form the structure shown in FIG. 17, where the parts of each dummy wordline 300 in the conductor layer 100 are exposed to the passages 101.

Figure 18:
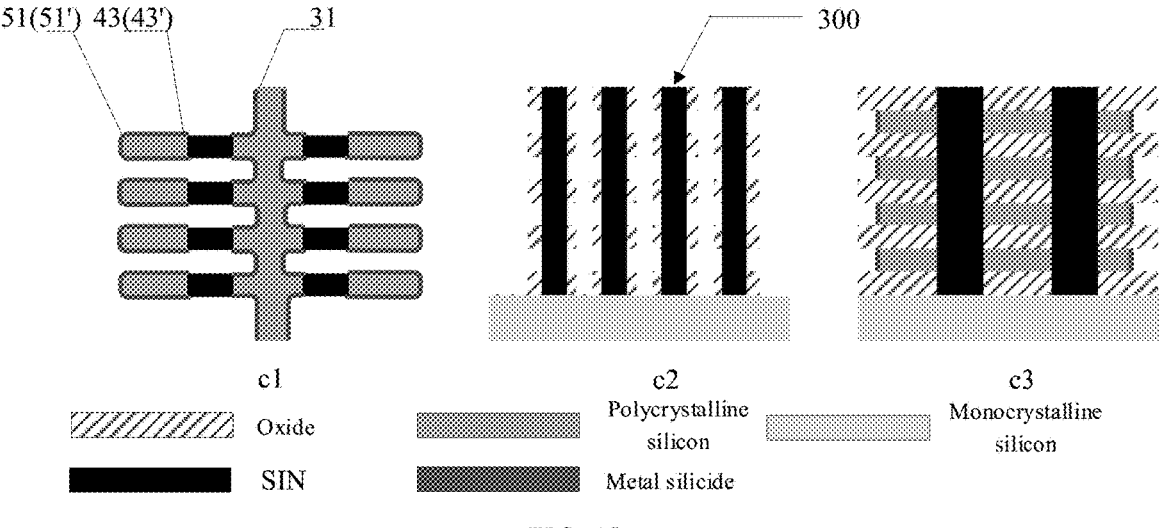
FIG. 18 is a structural schematic diagram of the formed metal silicide layer according to some embodiments of the present disclosure.

Based on this, the method for implementing Step 1303 is as follows: depositing a metal film on the inner wall of the passage 101; and annealing the metal film to metallize the silicon on the surface of the conductor layer 100, as shown in FIG. 18, resulting in a plurality of first branch lines 31 of a bitline 3 in each conductor layer 100.

Exemplarily, the method for depositing the metal film on the inner wall of the passage 101 is as follows: using the atomic layer deposition (ALD) technology to deposit metal Pt on the inner wall of the passage 101.

Upon depositing the metal film on the inner wall of the passage 101, the metal film is deposited on the sidewalls of both the conductor layer 100 and the isolation layer 200 in the passage 101. However, during annealing, only the silicon in the conductor layer 100 reacts with the metal film to generate a metal silicide (SILICIDE), while the oxide in the isolation layer 200 does not react with the metal film. Therefore, after the annealing and stripping away the metal film, a plurality of first branch lines 31 of a bitline 3 in each conductor layer 100 are then formed.

In addition, upon stripping away the metal film, annealing treatment is continued to further improve the stability of the metal silicide.

In some embodiments, as shown in FIG. 18, upon metallizing each conductor layer 100, the first conductive layers 43 for a column of memory cells 1 are also formed in each conductor layer 100.

In some embodiments, as shown in FIG. 18, upon metallizing each conductor layer 100, the first conductive layers 43 and the second conductive layer 51 for a column of memory cells 1 are also formed in each conductor layer 100.

The part of the first branch line 31 near the semiconductor layer 41 serves as the drain 42 of the transistor, the first conductive layer 43 serves as the source 43' of the transistor, and the second conductive layer 51 serves as the first electrode 51' of the capacitor. In this case, the drain 42 of the transistor, the source 43' of the transistor, the first electrode 51' of the capacitor, and part of the bitline 3 in each memory cell are all fabricated in an integrated manner through a silicon metallization process, enhancing the manufacturing efficiency of the memory.

After obtaining the structure shown in FIG. 18, connecting each first branch line together forms a complete bitline. As shown in FIG. 18, the dummy wordline 300 is connected to the first branch line 31 by means of an end surface connection. This limits the contact area between the channel of the transistor formed later in the dummy wordline 300 and the bitline to only the area of the end surface, thus reducing the contact area between the channel of the transistor and bitline, and consequently reducing the parasitic capacitance between the wordline and the bitline. Moreover, as shown in FIG. 18, the source 43' of the transistor is also connected to the first electrode 51' by means of an end surface connection. This also limits the contact area between the channel of the transistor and the first electrode 51' to only the area of the end surface, thus reducing the contact area between the channel of the transistor and the first electrode 51', and consequently lowering the parasitic capacitance between the wordline and the capacitor.

Step 1304: filling an insulation material in the semi-enclosed areas surrounded by each dummy wordline 300 and two adjacent first branch lines 31.

The filling of the insulation material in the semi-enclosed areas surrounded by each dummy wordline 300 and two adjacent first branch lines 31 enables the filling of the insulation material in the area directly facing the channel formed later in the dummy wordline 300 and the bitline. This reduces the contact area between the channel and the bitline, thereby reducing the parasitic capacitance between the wordline and the bitline.

In some embodiments, the silicon in the semi-enclosed area surrounded by the dummy wordline 300 and the first conductive layer 43 can also be replaced with an insulation material to further reduce the parasitic capacitance between the wordline and the capacitor.

Figure 19:
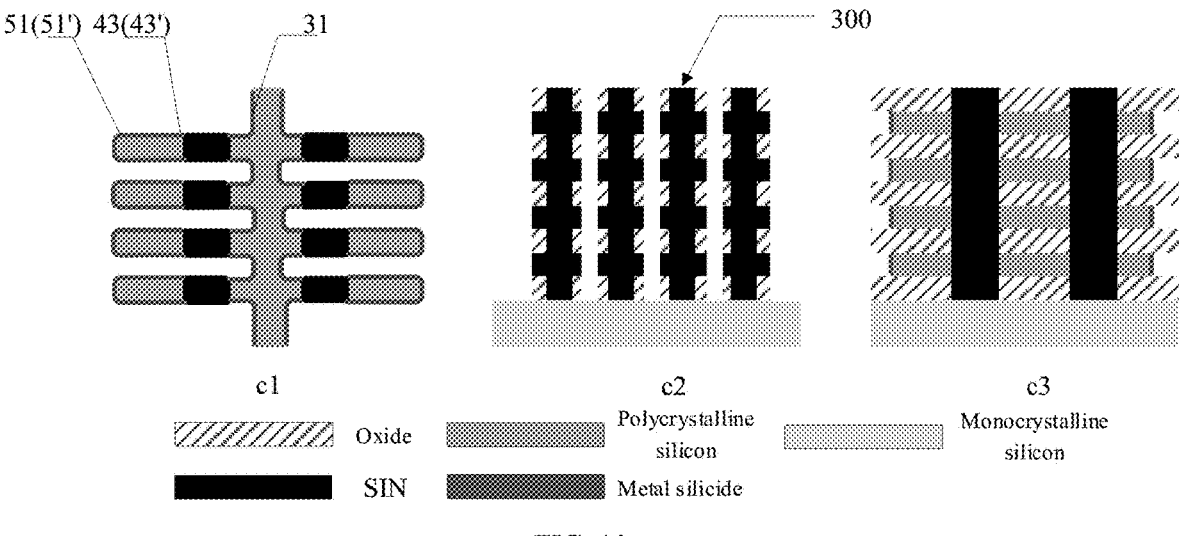
FIG. 19 is a structural schematic diagram of an intermediate product in the manufacturing process according to some embodiments of the present disclosure.
Figure 20:
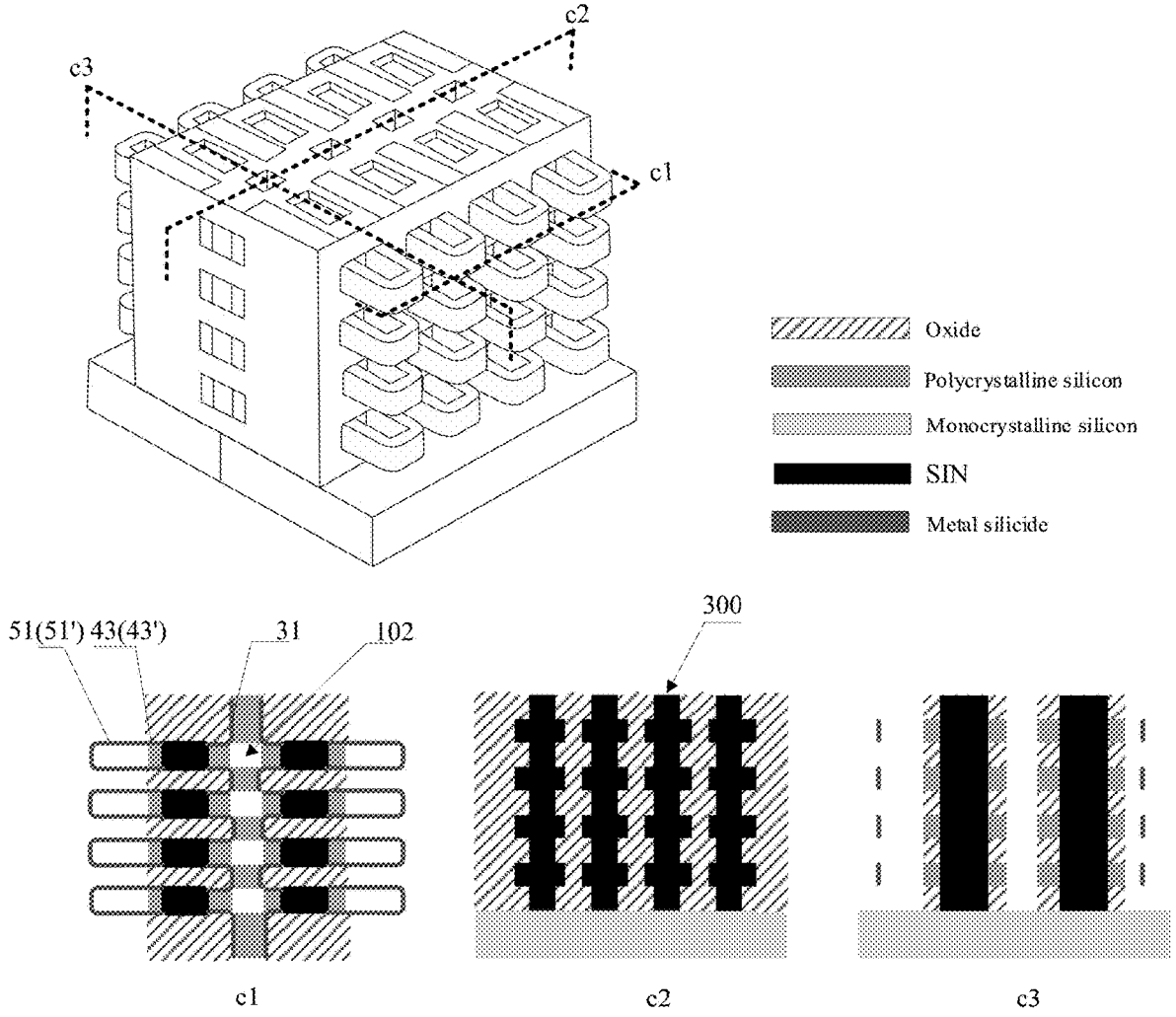
FIG. 20 is a structural schematic diagram of the second through holes formed after etching according to some embodiments of the present disclosure.
Figures 21, 22:
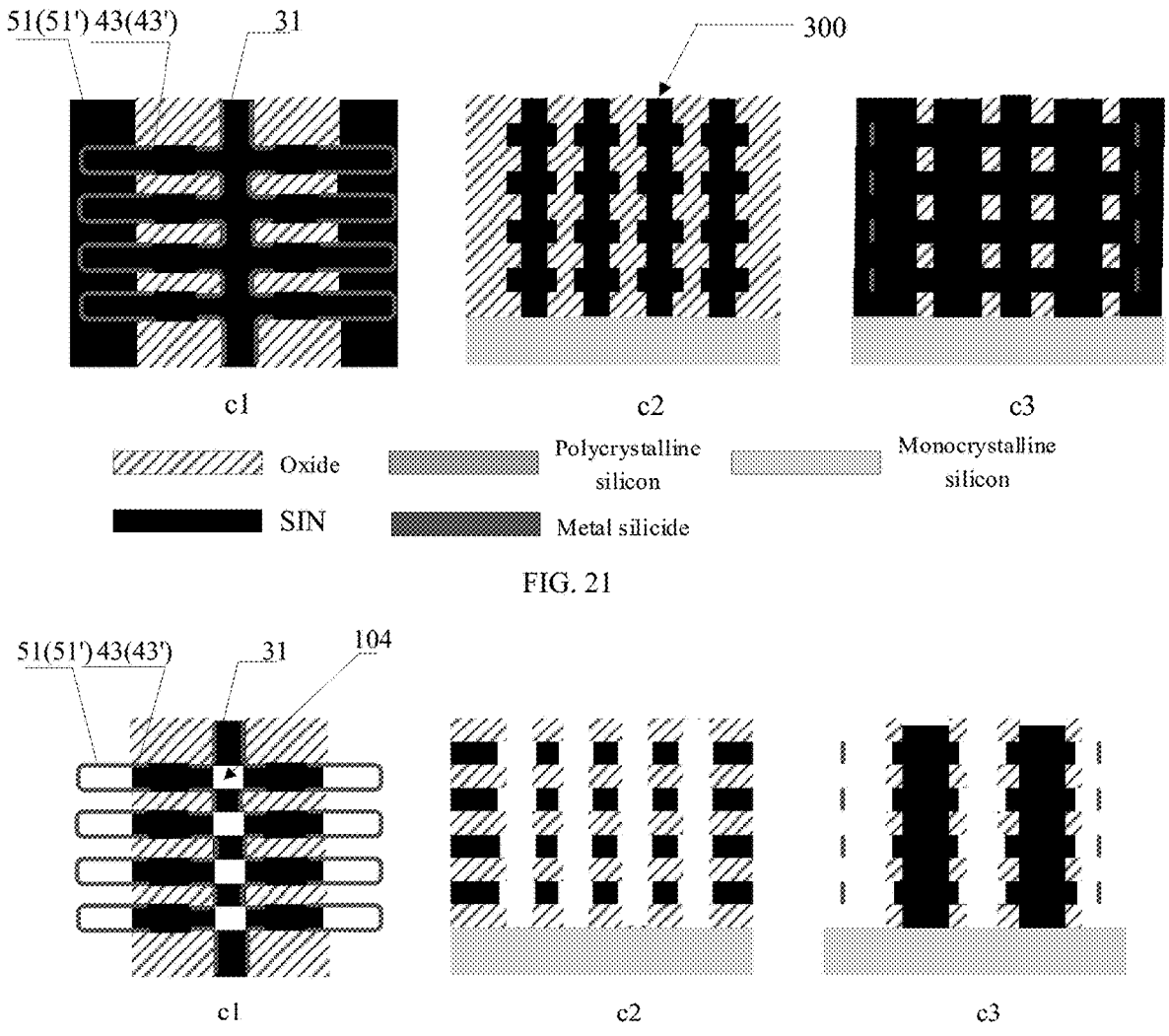
FIG. 21 is a structural schematic diagram of another intermediate product after filling with an insulation material according to some embodiments of the present disclosure.
FIG. 22 is a structural schematic diagram of the first through holes formed after etching according to some embodiments of the present disclosure.

In some embodiments, as shown in FIGS. 19 to 21, the method for replacing the silicon in the semi-enclosed area surrounded by the dummy wordline 300 and the first branch line 31 and the semi-enclosed area surrounded by the dummy wordline 300 and the first conductive layer 43 with the insulation material is as follows: etching the plurality of conductor layers 100 and the plurality of isolation layers 200 to form a plurality of second through holes 102 that penetrate through the plurality of conductor layers 100 and the plurality of isolation layers 200 and are disposed in the semi-enclosed areas surrounded by each dummy wordline and two adjacent first branch lines 31, with both the inner and outer walls of the second conductive layer 51 exposed; etching away the silicon of each conductor layer 100 among the plurality of conductor layers 100; depositing the insulation material in the gaps between the plurality of conductor layers 100 and the plurality of isolation layers 200 after being etched, such that the semi-enclosed area surrounded by the dummy wordline 300 and the first branch line 31 and the semi-enclosed area surrounded by the dummy wordline 300 and the first conductive layer 43 are filled with the insulation material.

Specifically, after obtaining the structure shown in FIG. 18, to facilitate the subsequent filling of the insulation material, SiN, an insulation material, is first deposited on the sidewalls of the structure shown in FIG. 18. This ensures that the grooves surrounding the sidewalls of the dummy wordlines 300 in the cross-sectional view of c2 in FIG. 18 are filled with the insulation material of SiN, resulting in the structure shown in FIG. 19.

After obtaining the structure shown in FIG. 19, to replace the silicon in the semi-enclosed area surrounded by the dummy wordline 300 and the first branch line 31 and the semi-enclosed area surrounded by the dummy wordline 300 and the first conductive layer 43 with the insulation material, thereby reducing the parasitic capacitance between the wordline and the bitline as well as between the wordline and the capacitor, oxide is filled in all the gaps in the structure shown in FIG. 19, and then the stacked layers are etched through the mask to form a plurality of second through holes 102 that penetrate through the plurality of conductor layers 100 and the plurality of isolation layers 200 and are disposed in the semi-enclosed areas surrounded by each dummy wordline and two adjacent first branch lines 31, with the inner wall of the second conductive layer 51 exposed, resulting in the structure shown in FIG. 20.

Then, the silicon around the second through holes 102 in each conductor layer and the silicon near the second conductive layer 51 are etched away in an isotropic manner to remove the silicon in the semi-enclosed area surrounded by the dummy wordline 300 and the first branch line 31 and the semi-enclosed area surrounded by the dummy wordline 300 and the first conductive layer 43 in the conductor layer 100. Then, the insulation material is deposited in all the gaps of the etched structure, resulting in the structure shown in FIG. 21. As shown in FIG. 21, the semi-enclosed area surrounded by the dummy wordline 300 and the first branch line 31 and the semi-enclosed area surrounded by the dummy wordline 300 and the first conductive layer 43 in the conductor layer 100 have been filled with the insulation material.

The above is illustrated with the example of simultaneously filling the insulation material in the semi-enclosed area surrounded by the dummy wordline 300 and the first branch line 31 and in the semi-enclosed area surrounded by the dummy wordline 300 and the first conductive layer 43. In some embodiments, the operation of filling the insulation material in the semi-enclosed area surrounded by the dummy wordline 300 and the first branch line 31 and the operation of filling the insulation material in the semi-enclosed area surrounded by the dummy wordline 300 and the first conductive layer 43 can be performed separately, which is not limited in the embodiments disclosed herein.

Exemplarily, upon obtaining the first branch line 31 as shown in FIG. 18, the insulation material is filled in the first semi-enclosed area surrounded by the dummy wordline 300 and the first branch line 31.

Exemplarily, upon obtaining the source 43' of the transistor as shown in FIG. 18, the insulation material is filled in the second semi-enclosed area surrounded by the dummy wordline 300 and the first conductive layer 43.

Step 1305: connecting the plurality of first branch lines 31 in each conductor layer 100 to form second branch lines 32 disposed between every two adjacent first branch lines 31.

Figures 23, 24:
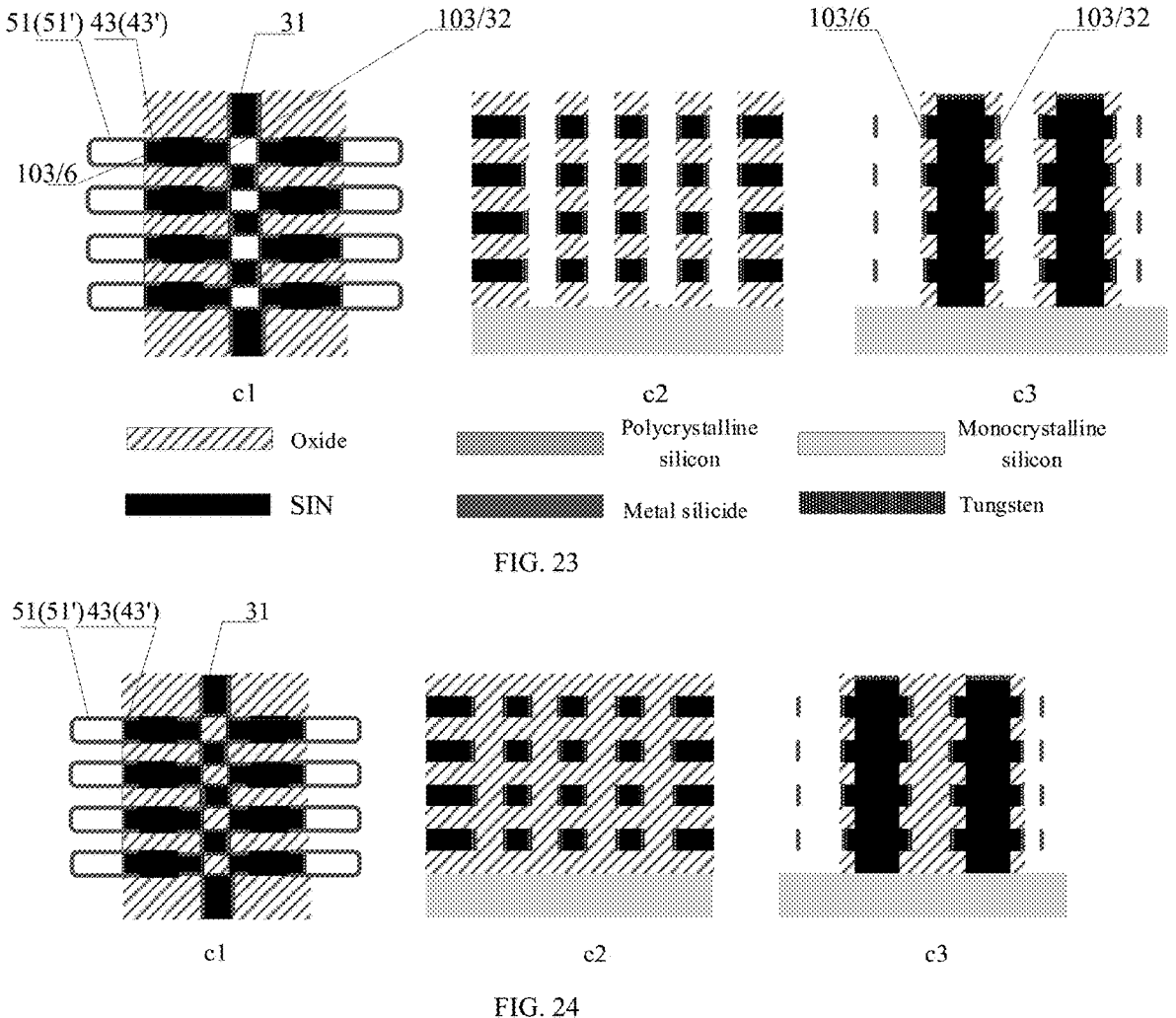
FIG. 23 is a structural schematic diagram of the first metal layer according to some embodiments of the present disclosure.
FIG. 24 is a structural schematic diagram of an intermediate product after depositing oxide according to some embodiments of the present disclosure.

In some embodiments, after obtaining the structure shown in FIG. 21 through Step 1304, as shown in FIGS. 22 and 23, the method for implementing Step 1305 is as follows: etching the plurality of conductor layers 100 and the plurality of isolation layers 200 to form a plurality of first through holes 104 that penetrate through the plurality of conductor layers 100 and the plurality of isolation layers 200 and are disposed between every two adjacent first branch lines 31, with the inner wall of the second conductive layer 51 exposed; depositing the first metal layer 103 on the inner wall of each first through hole 104 and the inner wall of each second conductive layer 51 near the first conductive layer 43; etching the first metal layer 103 disposed on each isolation layer 200 and retaining the first metal layer 103 disposed on each conductor layer 100 to obtain a plurality of second branch lines 32 and a plurality of third conductive layers 6 disposed on each conductor layer 100. The bitline 3 disposed in each conductor layer 100 includes a plurality of first branch lines 31 and the second branch lines 32 disposed between every two adjacent first branch lines 31.

Specifically, for the structure shown in FIG. 21, the stacked layers shown in FIG. 21 are anisotropically etched firstly to form the first through holes 104, with both sides of the second conductive layer 51 exposed. Then, the SiN is isotropically etched to obtain the structure shown in FIG. 22. This process causes the inner wall of the first through hole as well as the two sidewalls as shown in the cross-sectional view of c1 in the conductor layer 100 to slightly indent, while the sidewalls in the isolation layer 200 to slightly protrude, facilitating the implementation in subsequent processes.

After obtaining the structure shown in FIG. 22, a tungsten W layer is deposited on the inner wall of the first through hole 104 and the inner walls on both sides of the second conductive layer 51 near the end surface in the structure shown in FIG. 22, resulting in the first metal layer 103. Since in FIG. 22, the inner wall of the first through hole as well as the two sidewalls as shown in the cross-sectional view of c1 in the conductor layer 100 are slightly indented, while the sidewalls in the isolation layer 200 slightly protrude, the tungsten W layer deposited on the inner wall of the first through hole and the tungsten W layer deposited on the two sidewalls as shown in the cross-sectional view of c1 in the conductor layer 100 are slightly indented, while the tungsten W layer deposited on the sidewalls in the isolation layer 200 slightly protrudes. Then, after isotropically etching the tungsten W layer, the tungsten W layer at the protruding parts in the isolation layer is etched away, thereby retaining the tungsten W layer in the conductor layer 100, resulting in the structure shown in FIG. 23.

The above is illustrated with the example of obtaining the second branch line 32 and the third conductive layer 6 simultaneously through a single process. In some embodiments, the two structures are formed separately.

Exemplarily, the method for separately forming the second branch line 32 is as follows: etching the plurality of conductor layers 100 and the plurality of isolation layers 200 to form a plurality of first through holes 104 that penetrate through the plurality of conductor layers 100 and the plurality of isolation layers 200 and are disposed between every two adjacent first branch lines 31 in each conductor layer 100; depositing the first metal layer 103 on the inner walls of the first through holes 104; etching the first metal layer 103 disposed on the isolation layer 200 and retaining the first metal layer 103 disposed on the conductor layer 100 to obtain the second branch line 32 disposed on the conductor layer 100. The bitline 3 includes two first branch lines 31 and the second branch line 32.

Exemplarily, the method for separately forming the third conductive layer 6 is as follows: etching the plurality of conductor layers 100 and the plurality of isolation layers 200 to expose the inner wall of the second conductive layer 51 in each conductor layer; depositing the first metal layer 103 on the inner side of the second conductive layer 51 near the first conductive layer 43; etching the first metal layer 103 disposed on the isolation layer 200 and retaining the first metal layer 103 disposed on the conductor layer 100 to obtain the third conductive layer 6 disposed on the conductive layer 100.

The second conductive layer 51 obtained through the above process serves as the first electrode 51' of the capacitor in the memory cell. After obtaining the first electrode 51' of the capacitor 5 in each memory cell through the above process, the second electrode of the capacitor is further manufactured.

Figure 25:
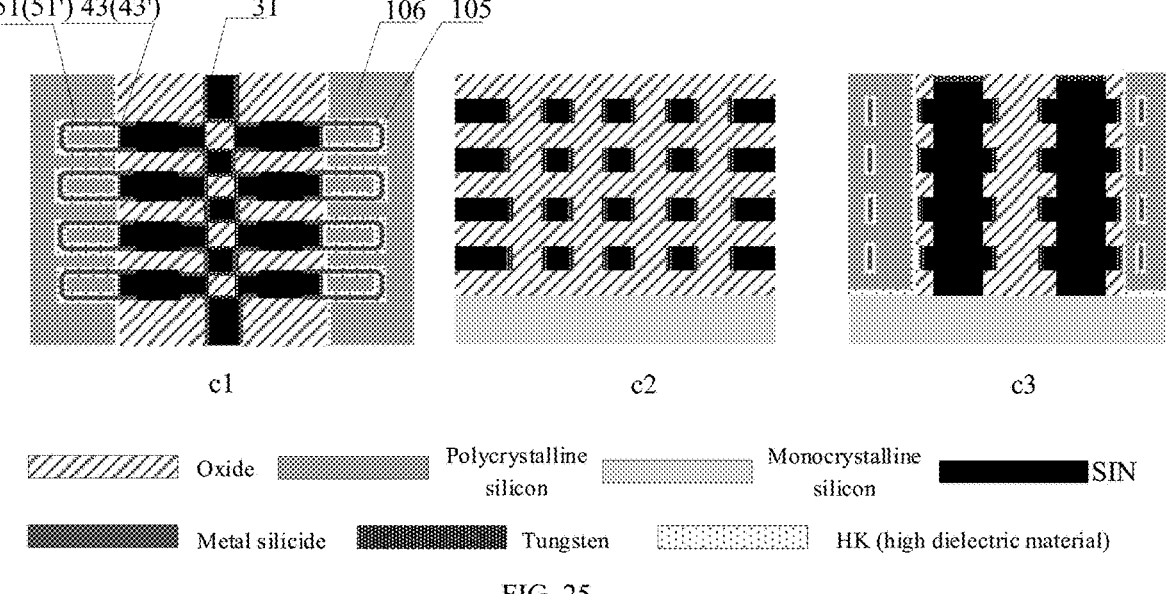
FIG. 25 is a structural schematic diagram of the first dielectric layer and the silicon layer according to some embodiments of the present disclosure.

In some embodiments, as shown in FIGS. 24 to 25, the method for manufacturing the second electrode of the capacitor is as follows: sequentially depositing the first dielectric layer 105 and the silicon layer 106 on both sides of the plurality of second conductive layers 51 in each conductor layer 100. The silicon layer 106 serves as the second electrode of the capacitor.

Specifically, after obtaining the structure shown in FIG. 23, the oxide is deposited firstly in the gaps of the structure shown in FIG. 23 to facilitate subsequent operations on the stacked layers. Then, the oxide on both sides of the first electrode 51' is etched away through the mask to expose both sides of the first electrode 51', resulting in the structure shown in FIG. 24.

After obtaining the structure shown in FIG. 24, a layer of high dielectric (HK) material is deposited on both sides of the first electrode 51' to obtain a first dielectric layer 105.

Then, polycrystalline silicon (poly) is deposited on the outer walls of the first dielectric layer 105 disposed on both sides of the first electrode 51' to obtain the silicon layer 106, thereby resulting in the structure shown in FIG. 25.

As shown in the cross-sectional view of c3 in FIG. 25, silicon is also filled in the area between the upper and lower surfaces of the capacitor in each layer of the memory cell array, allowing the two parts of the silicon layer on both sides of the first electrode 51' in the cross-sectional view of c1 to be connected to serve as the second electrode of the capacitor.

Step 1306: etching away each dummy wordline 300 and forming a plurality of wordlines 2 and semiconductor layers 41 surrounding each wordline 2.

In some embodiments, the method for implementing Step 1306 is as follows: etching away the plurality of dummy wordlines 300 to form a plurality of third through holes that penetrate through the plurality of conductor layers 100 and the plurality of isolation layers 200; sequentially depositing a channel layer 301, a second dielectric layer 302, and a second metal layer 303 on the inner wall of each third through hole to form the semiconductor layer 41, gate insulating layer, and a plurality of wordlines 2 for each memory cell, resulting in the structure shown in FIG. 26; etching the channel layer 301 disposed on each isolation layer 200 to expose the second dielectric layer 302 disposed on each isolation layer 200, resulting in the structure shown in FIG. 27.

Figures 26, 27:
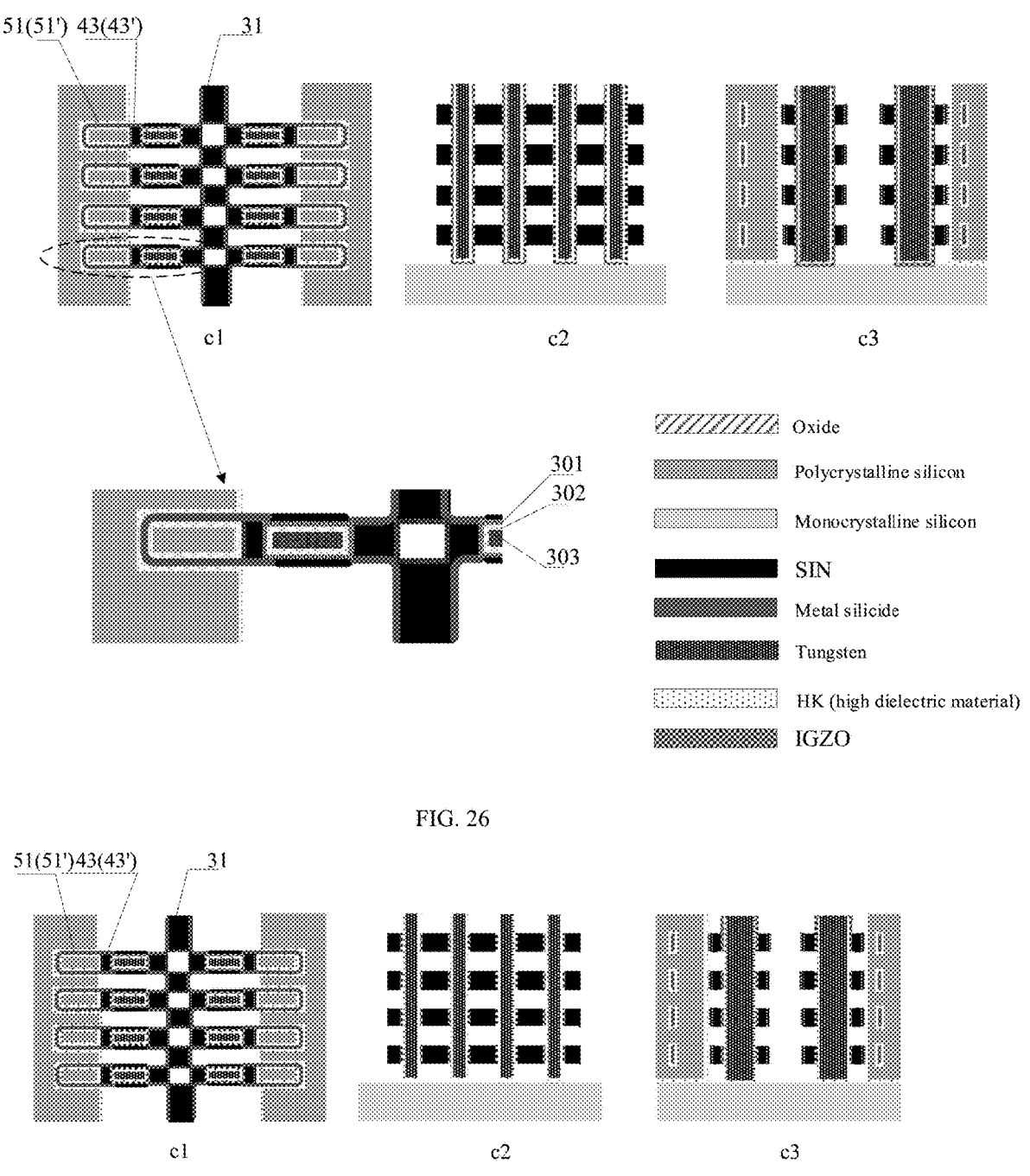
FIG. 26 is a structural schematic diagram of a wordline according to some embodiments of the present disclosure.
FIG. 27 is a structural schematic diagram of a memory after etching the channel layer in the isolation layer according to some embodiments of the present disclosure.

Exemplarily, as shown in FIG. 26, the channel layer 301 is made of metal oxide, polycrystalline silicon, or monocrystalline silicon, among other materials.

The metal oxide material is indium gallium zinc oxide (IGZO). In the case that the metal oxide material is IGZO, the leakage current of the transistor 11 is small (less than or equal to 10 to 15A), ensuring a low refresh rate for the dynamic memory. It should be noted that the metal oxide material may also be ITO, IWO, ZnOx, InOx, $In_2O_3$, InWO, $SnO_2$, TiOx, InSnOx, ZnxOyNz, MgxZnyOz, InxZnyOz, InxGayZnzOa, ZrxInyZnzOa, HfxInyZnzOa, SnxInyZn-zOa, AlxSnyInzZnaOd, SixInyZnzOa, ZnxSnyOz, AlxZ-nySnzOa, GaxZnySnzOa, ZrxZnySnzOa, InGaSiO, IAZO, IGO, IZO (indium-zinc-oxide), IZOx, etc. The specific material needs to ensure that the leakage current of the transistor meets the requirements, and then the material can be adjusted according to the actual situation.

The second dielectric layer 302 is made of a high dielectric (HK) material, and the second metal layer 303 is made of tungsten W.

In addition, a layer of TiN (not shown in FIG. 26) is also deposited between the second dielectric layer 302 and the second metal layer 303. TiN serves two purposes: one is to serve as an adhesive to prevent the second metal layer 303 from peeling off, and the other is to prevent the second metal layer 303 from diffusing into the channel.

In addition, etching the channel layer 301 disposed on each isolation layer 200 to expose the second dielectric layer 302 disposed on each isolation layer 200 reduces the parasitic MOS (metal-oxide-semiconductor) field-effect transistors in the memory.

Figure 28:
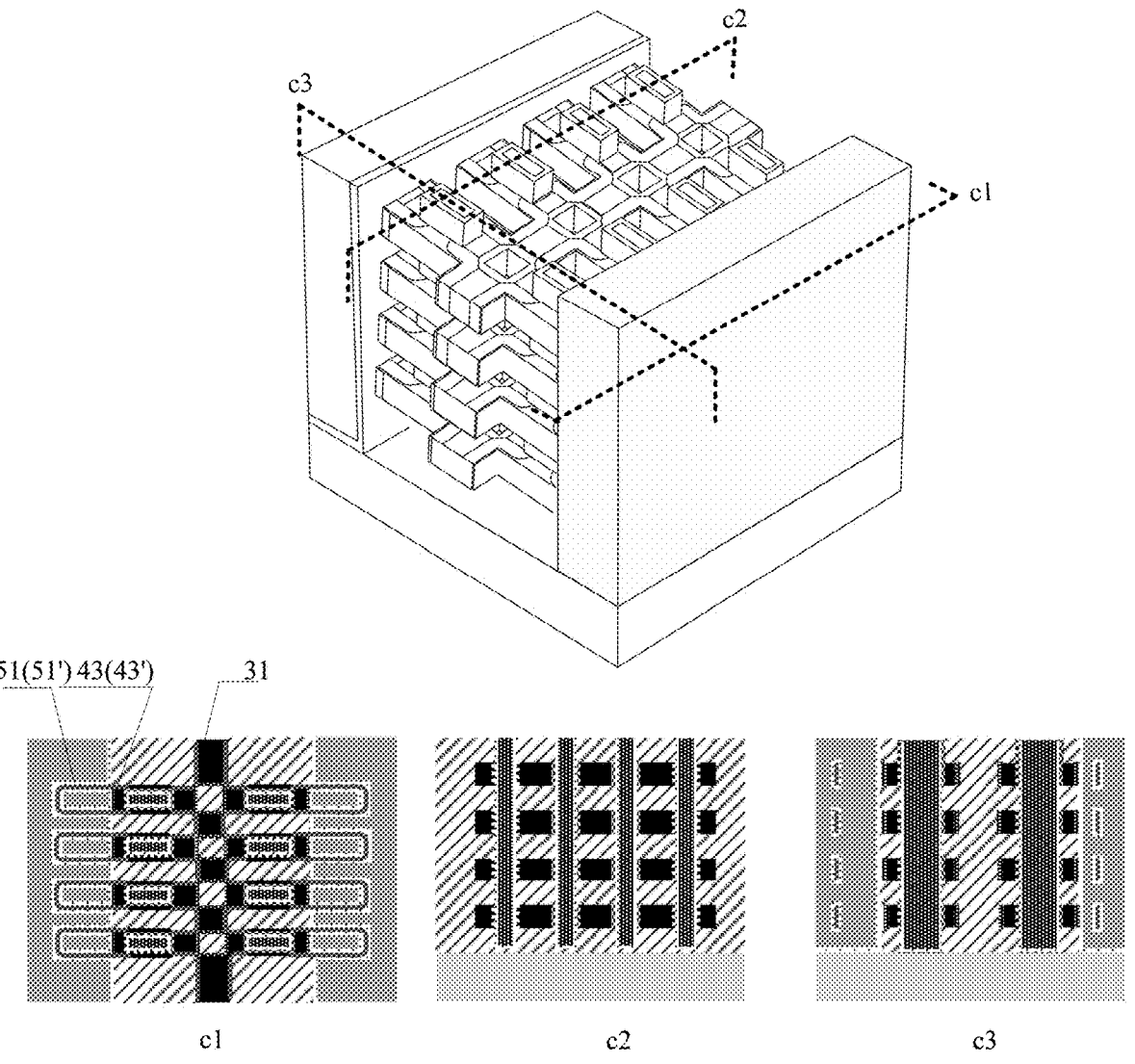
FIG. 28 is a complete view of the memory corresponding to FIG. 27.

In addition, as in FIG. 25, the blank spaces in FIGS. 26 and 27 are filled with oxide, which is not shown in FIGS. 26 and 27. FIG. 28 shows a complete view of the memory corresponding to FIG. 27. As shown in FIG. 28, the blank spaces in the structure shown in FIG. 27 are all filled with oxide. Further descriptions of the structure shown in FIG. 28 can refer to the aforementioned embodiments, which will not be reiterated here.

All the optional technical solutions mentioned above can be combined in any form to constitute optional embodiments of the present disclosure, which will not be reiterated in the embodiments disclosed herein.

It should be noted that the process flow shown in FIG. 13 is exemplary, and the embodiments disclosed herein do not limit the method for manufacturing the memory shown in FIGS. 2 to 12.

In summary, in the embodiments disclosed herein, the bitline includes a plurality of first branch lines and a plurality of second branch lines, with one second branch line connected between every two adjacent first branch lines. That is, the bitline is composed of different branch lines. Additionally, the semiconductor layer of each memory cell is connected to two adjacent first branch lines but is not connected to at least a part of the region, between the two adjacent first branch lines, of the second branch line. Compared to the channel of the memory cell in FIG. 1, which is directly connected to the conductive pillar serving as a bitline, the memory provided according to the embodiments disclosed herein reduces the contact area between the semiconductor layer of the memory cell and the bitline, thereby reducing the parasitic capacitance between the wordline and the bitline.

Further, in the case that the memory provided according to the embodiments disclosed herein is a 1T1C memory cell, the embodiments disclosed herein further provide a process optimization flow that reduces the parasitic capacitance between the wordline and bitline, as well as between the wordline and the capacitor in the 1T1C memory cell. In the optimized process flow, firstly, a stacked structure is manufactured using oxide/polycrystalline silicon, and the basic framework is etched out, followed by the making of dummy wordlines. Next, the disconnected bitlines are obtained through the silicon metallization process. After that, the insulation material SiN is filled between the bitlines and the dummy wordlines. Then, the disconnected bitlines are connected. Finally, the dummy wordlines are replaced with actual wordlines, and the parasitic MOS is removed.

The optimized process flow reduces parasitic capacitance without compromising device performance and at the same time alters the shape of the capacitor within the memory cell. This allows the capacitor in the memory cell to occupy a smaller area and is compatible with the process of removing parasitic MOS.

In addition, the embodiments disclosed herein further provide an electronic device that includes at least one semiconductor device as described in the aforementioned embodiments. The electronic device includes, but is not limited to, smart phones, computers, tablets, artificial intelligence devices, wearable devices, or smart mobile terminals.

Unless otherwise defined, the technical or scientific terms used in the embodiments disclosed herein should be understood in the general sense by those of ordinary skill in the art to which the present disclosure belongs.

The embodiments disclosed herein are not necessarily limited to the dimensions indicated, and the shapes and sizes of various components in the accompanying drawings do not reflect the actual proportions. Furthermore, the accompanying drawings schematically show desirable examples, and the embodiments disclosed herein are not limited to the shapes or numerical values shown in the accompanying drawings.

Ordinal numbers such as "first", "second", and "third" in the embodiments disclosed herein are used to avoid confusion about constituent elements and do not indicate any order, quantity, or importance.

In the embodiments disclosed herein, for convenience, terms indicating orientations or positional relationships such as "middle", "upper", "lower", "front", "back", "vertical", "horizontal", "top", "bottom", "inner", and "outer" are used to refer to the positional relationships of the constituent elements in the accompanying drawings. The terms are merely used to facilitate the description of the specification and simplify the description and do not indicate or imply that the referred apparatuses or elements must possess a specific orientation, be constructed and operated in a particular orientation, and thus should not be considered as limiting the scope of the embodiments disclosed herein. The positional relationships of the constituent elements are appropriately changed according to the direction in which the constituent elements are described. Therefore, the terms used in the disclosure are not limiting and can be appropriately replaced according to the context.

In the embodiments disclosed herein, unless explicitly defined and limited, terms like "install", "connect", and "link" should be understood broadly. For example, the terms can imply a fixed connection, a detachable connection, or an integral connection, imply mechanical or electrical connections, and imply a direct connection, or an indirect connection through an intermediate medium, or an internal communication within two elements. For those of ordinary skill in the art, the specific meanings of the above terms in the embodiments disclosed herein are interpreted according to specific conditions.

In the embodiments disclosed herein, in the case that the transistors having opposite polarities are used, or in the case that a current direction during circuit operation changes, the functions of the "source" and the "drain" may sometimes be interchanged. Therefore, in the embodiments disclosed herein, "source" and "drain" may be interchanged with each other.

In the embodiments disclosed herein, "electrical connection" includes the scenario where constituent elements are connected via elements that have some electrical function. There are no particular restrictions on the "elements that have some electrical function" as long as these elements can facilitate the transmission and reception of electrical signals between connected constituent elements. Examples of the "elements that have some electrical function" include not only electrodes and wiring but also switching elements like transistors, resistors, inductors, capacitors, and other elements with various functions.

In the embodiments disclosed herein, "parallel" refers to approximately parallel or nearly parallel, for example, in the case where two straight lines form an angle between $-10°$ and $10°$, which therefore also includes the cases where the angle is between $-5°$ and $5°$. In addition, "perpendicular" refers to approximately perpendicular, for example, in the case where two straight lines form an angle between $80°$ and $100°$, which therefore also includes the cases where the angle is between $85°$ and $95°$.

The above description is merely a preferred embodiment of the present disclosure and is not intended to limit the present disclosure. Any modifications, equivalents, improvements, and the like made within the spirit and principle of the present disclosure should fall within the protection scope of the present disclosure.

The invention claimed is:

1. A memory, comprising:
one or more layers of memory cell arrays stacked in a direction perpendicular to a substrate, wherein each layer of the memory cell array comprises a plurality of memory cells;
a plurality of wordlines penetrating through the one or more layers of the memory cell arrays; and
a plurality of bitlines, wherein each said memory cell comprises a semiconductor layer surrounding a sidewall of the wordline and extending along the sidewall, and each said bitline is connected to the semiconductor layers in a column of memory cells in one layer of the memory cell array;
wherein each said bitline comprises a plurality of first branch lines and a plurality of second branch lines, with one said second branch line connected between every two adjacent said first branch lines; the semiconductor layer of each said memory cell is connected to two adjacent said first branch lines but is not connected to at least a part of a region, between the two adjacent said first branch lines, of the second branch line.

2. The memory according to claim 1, wherein a region of the semiconductor layer between two adjacent said first branch lines is disposed opposite to the second branch line between the two adjacent said first branch lines.

3. The memory according to claim 2, wherein there is at least one of:
the second branch line comprises all or part of a region, facing the semiconductor layer, of the bitline, and an insulation material is filled between the region of the second branch line facing the semiconductor layer and the semiconductor layer; or
the insulation material is filled between the region of the semiconductor layer between the two adjacent said first branch lines and the second branch line oppositely disposed.

4. The memory according to claim 1, wherein the wordline is disposed opposite to the second branch line, and there is an overlapping area between projections of the wordline surrounded by the semiconductor layer and the second branch line oppositely positioned on a plane perpendicular to the substrate, wherein the plane perpendicular to the substrate extends along a column direction of one said column of memory cells; and
there is no overlapping area between projections of the wordline and the first branch line on the plane perpendicular to the substrate.

5. The memory according to claim 1, wherein each said first branch line comprises side surfaces and end surfaces, and the semiconductor layer is connected to at least one of the end surfaces and the side surfaces of two adjacent said first branch lines, respectively.

6. The memory according to claim 1, wherein the second branch line is provided with a via hole penetrating through an upper surface and a lower surface or a hole on the upper surface, wherein a dielectric layer is filled within the via hole or the hole.

7. The memory according to claim 1, wherein each said first branch line extends along the direction perpendicular to the substrate and exhibits a polygonal structure from a cross-sectional view along a plane parallel to the substrate, both ends of each said second branch line are respectively connected to bending points of two adjacent said first branch lines, and the semiconductor layer of each said memory cell is connected to one end of two adjacent said first branch lines, respectively.

8. The memory according to claim 1, wherein each said memory cell further comprises two first conductive layers connected respectively to the semiconductor layer and a second conductive layer connected to two said first conductive layers, wherein a region of the semiconductor layer of each said memory cell surrounded by two said first conductive layers is disposed opposite to the second conductive layer, and an insulation material is filled between the region of the semiconductor layer of each said memory cell surrounded by two adjacent said first conductive layers and the second conductive layer.

9. The memory according to claim 8, wherein the second conductive layer extends in the direction perpendicular to the substrate and exhibits a U-shaped structure from a cross-sectional view along a plane parallel to the substrate, and both the first conductive layer and the second conductive layer comprise side surfaces and end surfaces, wherein the end surfaces of two said first conductive layers of each said memory cell are connected respectively to the two end surfaces of the second conductive layer.

10. The memory according to claim 9, wherein each said memory cell further comprises a third conductive layer connected to inner walls on both sides of the second conductive layer near the end surface; and inner and outer walls of the U-shaped structure of the second conductive layer are respectively connected to a fourth conductive layer.

11. The memory according to claim 1, wherein each layer of the memory cell array comprises a first column of memory cells and a second column of memory cells, and a plurality of said bitlines comprise a first bitline and a second bitline, wherein the semiconductor layers in the first column of memory cells are connected to the first bitline, and the semiconductor layers in the second column of memory cells are connected to the second bitline;

the first bitline and the second bitline are disposed between the first column of memory cells and the second column of memory cells, and the first bitline and the second bitline share one second branch line.

12. A memory, comprising:

one or more layers of transistor arrays stacked in a direction perpendicular to a substrate, wherein each layer of the transistor array comprises a plurality of transistors;

a plurality of wordlines penetrating through the one or more layers of the transistor arrays; and a plurality of bitlines, wherein each said transistor comprises a channel surrounding each said wordline and a drain connected to the channel, and each said bitline is connected to the drains in a column of transistors in one layer of the transistor array, wherein an insulation material is filled between a first channel region of the channel of each said transistor and a first bitline region of the bitline, wherein the first channel region refers to a region of the channel directly facing the bitline, and the first bitline region refers to a region of the bitline directly facing the channel.

13. The memory according to claim 12, wherein the memory further comprises a plurality of capacitors, and each said transistor further comprises a source connected to the channel, wherein the source of each said transistor is connected to a first electrode of one said capacitor, and an insulation material is filled between a second channel region of the channel of each said transistor and a first electrode region of the first electrode, wherein the second channel region refers to a region of the channel directly facing the first electrode, and the first electrode region refers to a region of the first electrode directly facing the channel.

14. The memory according to claim 13, wherein the first electrode is of a U-shaped structure, and an open end of the first electrode is connected to the source; and the memory comprises a plurality of third conductive layers, wherein each said third conductive layer is connected to inner walls on both sides of the first electrode near the open end.

15. The memory according to claim 12, wherein each said bitline comprises a plurality of first bitline segments and a plurality of second bitline segments, with one said second bitline segment connected between every two adjacent said first bitline segments;

the first channel region of each said transistor directly faces one said second bitline segment.

16. A method for manufacturing a memory, wherein the memory is the memory according to claim 1, and the method comprises:

providing the substrate;

forming, on the substrate, a plurality of conductor layers and a plurality of isolation layers alternately stacked in the direction perpendicular to the substrate as well as a plurality of dummy wordlines that penetrate through a plurality of the conductor layers and a plurality of the isolation layers;

metallizing each said conductor layer to form a plurality of the first branch lines in each said conductor layer, with every two adjacent said first branch lines connected to one said dummy wordline;

filling an insulation material in semi-enclosed regions surrounded by each said dummy wordline and two adjacent said first branch lines;

connecting a plurality of the first branch lines in each said conductor layer to form second branch lines disposed between every two adjacent said first branch lines; and etching away each said dummy wordline and forming a plurality of the wordlines and the semiconductor layers surrounding each said wordline.

17. The method according to claim 16, wherein the conductor layer is made of silicon;

prior to metallizing the each said conductor layer, the method further comprises:

etching a plurality of the conductor layers and a plurality of the isolation layers to form passages that penetrate through a plurality of the conductor layers and a plurality of the isolation layers and are disposed on both sides of each said dummy wordline, with parts of each said dummy wordline in the conductor layer exposed to the passages;

and metallizing the each said conductor layer to form the plurality of the first branch lines in the each said conductor layer, with the every two adjacent said first branch lines connected to the one said dummy wordline, comprises:

depositing a metal film on an inner wall of the passage; and annealing the metal film to metallize the silicon on a surface of the conductor layer, resulting in a plurality of the first branch lines in each said conductor layer.

18. The method according to claim 16, wherein upon metallizing each said conductor layer, two first conductive layers connected to each said dummy wordline as well as a second conductive layer connected to two said first conductive layers are further formed in each said conductor layer, wherein the second conductive layer extends in the direction perpendicular to the substrate and exhibits a U-shaped structure from a cross-sectional view along a plane parallel to the substrate, and end faces of two said first conductive layers connected to each said dummy wordline are connected respectively to two end surfaces of one said second conductive layer;

connecting the plurality of the first branch lines in the each said conductor layer to form the second branch lines disposed between the every two adjacent said first branch lines, comprises:

etching a plurality of the conductor layers and a plurality of the isolation layers to form a plurality of first through holes that penetrate through a plurality of the conductor layers and a plurality of the isolation layers and are disposed between every two adjacent said first branch lines, with an inner wall of the second conductive layer exposed;

depositing a first metal layer on an inner wall of each said first through hole and an inner wall of each said second conductive layer near the first conductive layer; and etching the first metal layer disposed on each said isolation layer and retaining the first metal layer disposed on each said conductor layer to obtain a plurality of second branch lines and a plurality of third conductive layers disposed on each said conductor layer.

19. The method according to claim 18, wherein filling the insulation material in the semi-enclosed regions surrounded by the each said dummy wordline and the two adjacent said first branch lines, comprises:

etching a plurality of the conductor layers and a plurality of the isolation layers to form a plurality of second through holes that penetrate through a plurality of the conductor layers and a plurality of the isolation layers and are disposed in the semi-enclosed regions surrounded by each said dummy wordline and two adjacent said first branch lines, with both inner and outer walls of the second conductive layer exposed;

etching away the silicon of each conductor layer in a plurality of the conductor layers; and depositing the insulation material in gaps between a plurality of the conductor layers and a plurality of the isolation layers after being etched, such that the insulation material is filled between the semi-enclosed regions surrounded by each said dummy wordline and two adjacent said first branch lines in each said conductor layer as well as regions between each said dummy wordline and two said first conductive layers.

20. The method according to claim 16, wherein etching away the each said dummy wordline and forming the plurality of the wordlines and the semiconductor layers surrounding the each said wordline, comprises:

etching away a plurality of the dummy wordlines to form a plurality of third through holes that penetrate through a plurality of the conductor layers and a plurality of the isolation layers;

sequentially depositing a channel layer, a second dielectric layer, and a second metal layer on an inner wall of each said third through hole to form a semiconductor layer, a gate insulating layer, and a plurality of the wordlines for each said memory cell; and etching the channel layer disposed on each said isolation layer to expose the second dielectric layer disposed on each said isolation layer.

* * * * *